US012764970B2

(12) United States Patent
Lille et al.

(10) Patent No.: US 12,764,970 B2
(45) Date of Patent: Oct. 13, 2026

(54) CROSS-POINT MAGNETORESISTIVE MEMORY ARRAY CONTAINING CARBON-BASED LAYER AND METHOD OF MAKING THE SAME

(71) Applicant: WESTERN DIGITAL TECHNOLOGIES, INC., San Jose, CA (US)

(72) Inventors: Jeffrey Lille, Sunnyvale, CA (US); Jordan Katine, Mountain View, CA (US); Tiffany Santos, Palo Alto, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 446 days.

(21) Appl. No.: 18/363,542

(22) Filed: Aug. 1, 2023

(65) Prior Publication Data

US 2024/0373648 A1 Nov. 7, 2024

Related U.S. Application Data

(60) Provisional application No. 63/499,555, filed on May 2, 2023.

(51) Int. Cl.
*H10B 61/00* (2023.01)

(52) U.S. Cl.
CPC .................................... *H10B 61/10* (2023.02)

(58) Field of Classification Search
CPC ......... H10B 61/10; H10B 61/00; H10N 50/10
See application file for complete search history.

(56) References Cited

U.S. PATENT DOCUMENTS

| | | | |
|---|---|---|---|
| 6,767,655 | B2 | 7/2004 | Hiramoto et al. |
| 8,666,471 | B2 | 3/2014 | Rogers et al. |
| 9,349,440 | B1 | 5/2016 | Ma |
| 10,925,543 | B2 | 2/2021 | Rogers et al. |
| 11,056,534 | B2 | 7/2021 | Wan et al. |
| 11,271,036 | B2 | 3/2022 | Lille et al. |
| 11,538,817 | B2 | 12/2022 | Makala et al. |

(Continued)

OTHER PUBLICATIONS

Ik-Soo Kim et al., Amorphous Carbon Films for Electronic Applications, Adv. Mater. 2023, 35, 2204912, first published online Nov. 21, 2022 (Year: 2022).*

(Continued)

*Primary Examiner* — Shih Tsun A Chou
(74) *Attorney, Agent, or Firm* — THE MARBURY LAW GROUP PLLC

(57) ABSTRACT

A device structure includes first electrically conductive lines that are laterally spaced apart from each other, second electrically conductive lines that are vertically spaced apart from the first electrically conductive lines and are laterally spaced apart from each other, a two-dimensional array of magnetoresistive random access memory (MRAM) pillars located between the first electrically conductive lines and the second electrically conductive lines, and each of the MRAM pillars includes a respective reference layer, a respective nonmagnetic tunnel barrier layer, and a respective free layer, and a two-dimensional array of carbon-based layers contacting surfaces of the first electrically conductive lines and surfaces of the two-dimensional array of MRAM pillars.

15 Claims, 22 Drawing Sheets

(56) References Cited

U.S. PATENT DOCUMENTS

| | | | | |
|---|---|---|---|---|
| 2003/0013314 | A1 | 1/2003 | Ying et al. | |
| 2003/0181056 | A1 | 9/2003 | Kumar et al. | |
| 2008/0231361 | A1 | 9/2008 | Ludwig | |
| 2008/0290941 | A1 | 11/2008 | Ludwig | |
| 2013/0140649 | A1 | 6/2013 | Rogers et al. | |
| 2014/0087483 | A1 | 3/2014 | Ohsawa et al. | |
| 2014/0151826 | A1 | 6/2014 | Kelber et al. | |
| 2014/0173300 | A1 | 6/2014 | Yamazaki et al. | |
| 2014/0184162 | A1 | 7/2014 | Takahashi et al. | |
| 2015/0340090 | A1 | 11/2015 | Ma | |
| 2016/0072055 | A1* | 3/2016 | Seto | H10N 50/01 438/3 |
| 2017/0077388 | A1 | 3/2017 | Tsubata et al. | |
| 2017/0341183 | A1 | 11/2017 | Buller et al. | |
| 2017/0345476 | A1 | 11/2017 | Doczy et al. | |
| 2018/0301622 | A1 | 10/2018 | Kubo et al. | |
| 2019/0148632 | A1 | 5/2019 | Lee et al. | |
| 2020/0365657 | A1* | 11/2020 | Lee | H10B 61/10 |
| 2020/0411589 | A1 | 12/2020 | Wan et al. | |
| 2021/0013409 | A1 | 1/2021 | Lee et al. | |
| 2021/0131989 | A1 | 5/2021 | Klein et al. | |
| 2021/0408020 | A1 | 12/2021 | Makala et al. | |
| 2021/0408114 | A1 | 12/2021 | Lille et al. | |
| 2022/0307078 | A1 | 9/2022 | Nelson et al. | |
| 2022/0310903 | A1 | 9/2022 | Huang et al. | |
| 2022/0384524 | A1 | 12/2022 | Park et al. | |
| 2023/0371279 | A1* | 11/2023 | Wu | H10N 70/826 |

OTHER PUBLICATIONS

Panjan, P. et al., "Review of Growth Defects in Thin Films Prepared by PVD Techniques," *Coatings* 2020, vol. 10, No. 5, p. 447; https://doi.org/10.3390/coatings10050447.

Singh, B. et al., "Deposition of planarized dielectric layers by biased sputter deposition," *Journal of Vacuum Science & Technology B: Microelectronics Processing and Phenomena*, vol. 5, No. 2, pp. 567-574 (1987), https://doi.org/10.116/1.583950.

Woo, J. et al., "Comparative Study of Cross-Point MRAM Array with Exponential and Threshold Selectors for Read Operation," in *IEEE Electron Device Letters*, vol. 39, No. 5, pp. 680-683, May 2018, https://doi.org/10.1109/LED.2018.2821093.

U.S. Appl. No. 17/579,147, filed Jan. 19, 2022, SanDisk Technologies LLC.

U.S. Appl. No. 17/654,760, filed Mar. 14, 2022, SanDisk Technologies LLC.

U.S. Appl. No. 17/654,762, filed Mar. 14, 2022, SanDisk Technologies LLC.

U.S. Appl. No. 17/654,768, filed Mar. 14, 2022, SanDisk Technologies LLC.

U.S. Appl. No. 17/654,773, filed Mar. 14, 2022, SanDisk Technologies LLC.

U.S. Appl. No. 17/654,777, filed Mar. 14, 2022, SanDisk Technologies LLC.

U.S. Appl. No. 17/654,781, filed Mar. 14, 2022, SanDisk Technologies LLC.

U.S. Appl. No. 18/067,998, filed Dec. 19, 2022, SanDisk Technologies LLC.

* cited by examiner

CROSS-POINT MAGNETORESISTIVE MEMORY ARRAY CONTAINING CARBON-BASED LAYER AND METHOD OF MAKING THE SAME

FIELD

The present disclosure relates generally to the field of magnetic memory devices, and particularly to a cross-point magnetoresistive random access memory array containing a carbon-based layer and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell.

SUMMARY

According to an aspect of the present disclosure, a device structure includes first electrically conductive lines that are laterally spaced apart from each other, second electrically conductive lines that are vertically spaced apart from the first electrically conductive lines and are laterally spaced apart from each other, a two-dimensional array of magnetoresistive random access memory (MRAM) pillars located between the first electrically conductive lines and the second electrically conductive lines, and each of the MRAM pillars includes a respective reference layer, a respective nonmagnetic tunnel barrier layer, and a respective free layer, and a two-dimensional array of carbon-based layers contacting surfaces of the first electrically conductive lines and surfaces of the two-dimensional array of MRAM pillars.

According to another aspect of the present disclosure, a method of forming a magnetoresistive random access memory comprises forming first electrically conductive lines embedded in a first line-level dielectric layer over a substrate; forming a continuous carbon-based layer directly one the first electrically conductive lines and the first line-level dielectric layer; forming magnetoresistive random access memory (MRAM) layers directly on the continuous carbon-based layer; forming a two-dimensional array of MRAM pillars by patterning the MRAM layers, wherein each of the MRAM pillars comprises a magnetic tunnel junction comprising a respective reference layer, a respective nonmagnetic tunnel barrier layer, and a respective free layer; patterning the continuous carbon-based layer into a two-dimensional array of carbon-based layers; and forming second electrically conductive lines over the two-dimensional array of MRAM pillars.

BRIEF DESCRIPTION OF THE DRAWINGS

FIG. 3A is a top-down view, FIG. 3B is a vertical cross-sectional view along the vertical plane B-B' of FIG. 3A, and FIG. 3C is a vertical cross-sectional view along the vertical plane C-C' of FIG. 3A.

FIG. 4A is a top-down view, FIG. 4B is a vertical cross-sectional view along the vertical plane B-B' of FIG. 4A, and FIG. 4C is a vertical cross-sectional view along the vertical plane C-C' of FIG. 4A. FIG. 4D is a magnified view of a first configuration of exemplary structure of FIGS. 4A-4C. FIG. 4E is a magnified view of a second configuration of the exemplary structure of FIGS. 4A-4C.

FIG. 5A is a top-down view, FIG. 5B is a vertical cross-sectional view along the vertical plane B-B' of FIG. 5A, and FIG. 5C is a vertical cross-sectional view along the vertical plane C-C' of FIG. 5A.

FIG. 6A is a top-down view, FIG. 6B is a vertical cross-sectional view along the vertical plane B-B' of FIG. 6A, and FIG. 6C is a vertical cross-sectional view along the vertical plane C-C' of FIG. 6A.

FIG. 7A is a top-down view, FIG. 7B is a vertical cross-sectional view along the vertical plane B-B' of FIG. 7A, and FIG. 7C is a vertical cross-sectional view along the vertical plane C-C' of FIG. 7A. FIG. 7D is a magnified view of the first configuration of the exemplary structure of FIGS. 7A-7C. FIG. 7E is a magnified view of the second configuration of the exemplary structure of FIGS. 7A-7C.

FIG. 7F is a magnified view of a third configuration of the exemplary structure of FIGS. 7A-7C. FIG. 7G is a magnified view of a fourth configuration of the exemplary structure of FIGS. 7A-7C.

FIG. 8A is a top-down view, FIG. 8B is a vertical cross-sectional view along the vertical plane B-B' of FIG. 8A, and FIG. 8C is a vertical cross-sectional view along the vertical plane C-C' of FIG. 8A. FIG. 8D is a magnified view of the first configuration of the exemplary structure of FIGS. 8A-8C. FIG. 8E is a magnified view of the second configuration of the exemplary structure of FIGS. 8A-8C. FIG. 8F is a magnified view of a third configuration of the exemplary structure of FIGS. 8A-8C. FIG. 8G is a magnified view of a fourth configuration of the exemplary structure of FIGS. 8A-8C.

FIG. 9A is a top-down view, FIG. 9B is a vertical cross-sectional view along the vertical plane B-B' of FIG. 9A, and FIG. 9C is a vertical cross-sectional view along the vertical plane C-C' of FIG. 9A.

FIG. 10A is a top-down view, FIG. 10B is a vertical cross-sectional view along the vertical plane B-B' of FIG. 10A, and FIG. 10C is a vertical cross-sectional view along the vertical plane C-C' of FIG. 10A.

FIG. 11A is a top-down view, FIG. 11B is a vertical cross-sectional view along the vertical plane B-B' of FIG. 11A, and FIG. 11C is a vertical cross-sectional view along the vertical plane C-C' of FIG. 11A.

FIG. 12A is a top-down view, FIG. 12B is a vertical cross-sectional view along the vertical plane B-B' of FIG. 12A, and FIG. 12C is a vertical cross-sectional view along the vertical plane C-C' of FIG. 12A.

DETAILED DESCRIPTION

Figure 1:
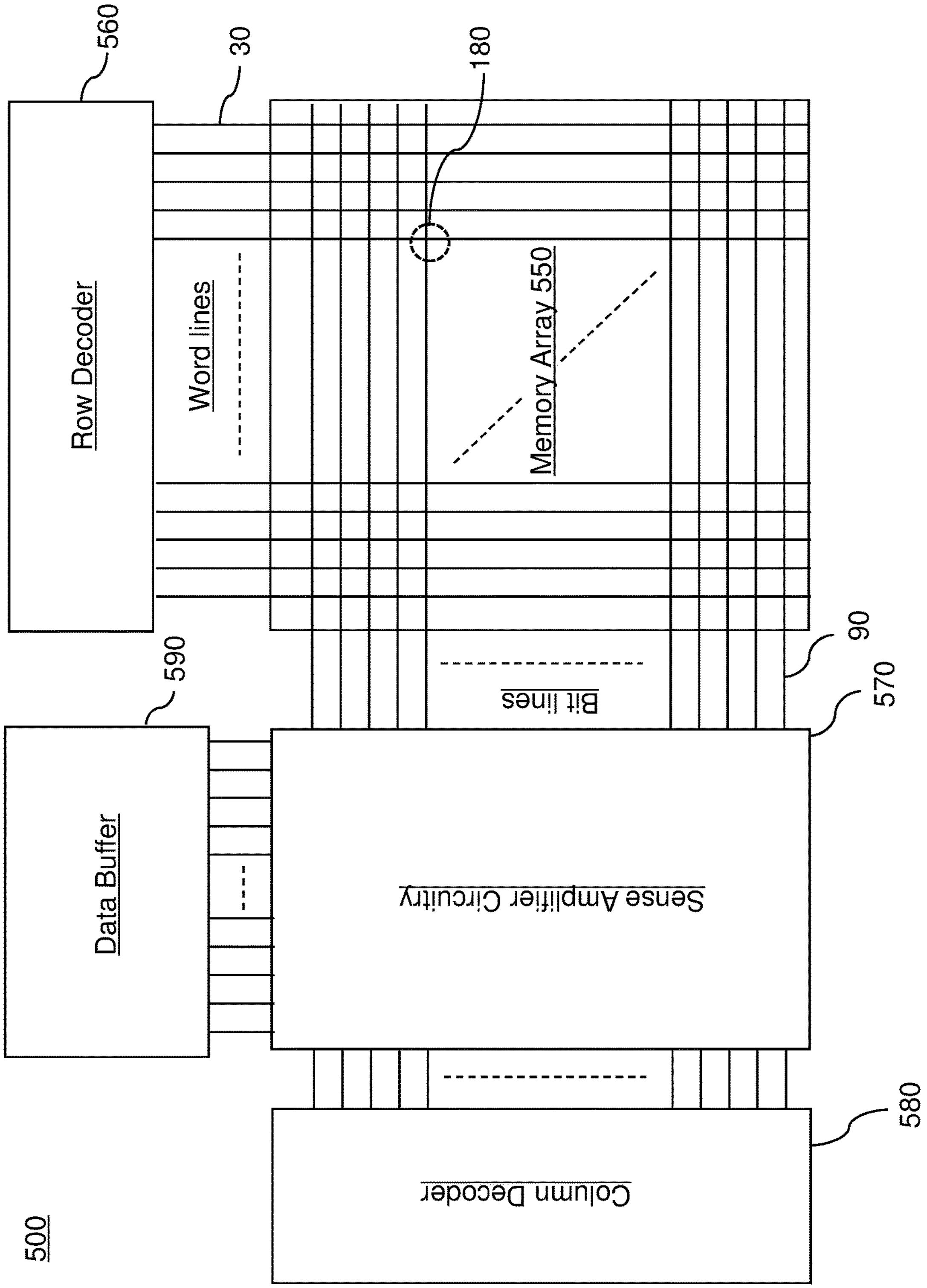
FIG. 1 is a schematic diagram of a memory device including resistive memory cells of embodiments of the present disclosure in an array configuration.

As discussed above, the embodiments of the present disclosure are directed to a cross-point magnetoresistive random access memory array containing carbon-based layers and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "conductive material" refers to a material having electrical resistivity less than 10 milliOhm-cm. As used herein, an "insulating material" or a "dielectric material" refers to a material having electrical conductivity less than $1.0\times10^{-6}$ S/cm. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "RAM device" refers to a memory device containing memory cells that allow random access, e.g., access to any selected memory cell upon a command for reading the contents of the selected memory cell. As used herein, an "MRAM device" refers to a RAM device in which the memory cells are magnetoresistive memory cells. The MRAM device 500 may comprise a memory portion of a computer system, which may also include a logic portion, such as a microprocessor, etc.

The MRAM device 500 of an embodiment of the present disclosure includes a memory array region 550 containing an array of the respective MRAM cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
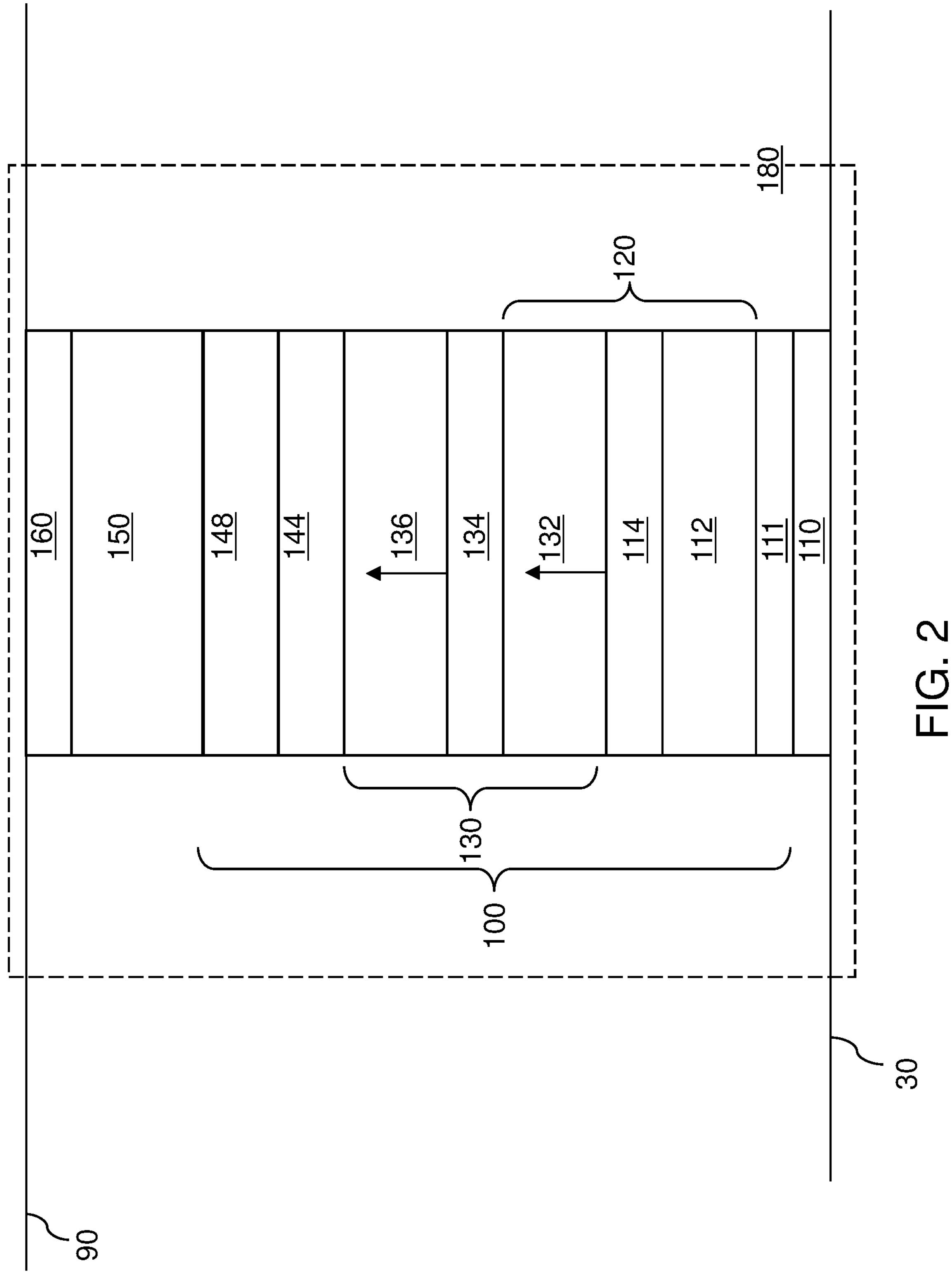
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

Generally, the MRAM cell 180 includes a magnetic tunnel junction (MTJ) 130. The magnetic tunnel junction 130 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (which may be a dielectric layer such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An metallic capping layer 148 may be formed on top of the free layer 136 in order to provide additional perpendicular anisotropy. A dielectric capping layer 144 may be provided between the free layer 136 and the metallic capping layer 148. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

In one embodiment, the reference layer 132 and the free layer 136 may include one or more ferromagnetic layers, such as CoFe or CoFeB. In plural ferromagnetic layers are included in the reference layer 132, then a thin non-magnetic layer comprised of tantalum or tungsten having a thickness of 0.2 nm~0.5 nm may be located between the ferromagnetic layers. The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over an optional nonmagnetic metallic seed layer 111, which may comprise a tantalum layer having a thickness of 0.5 nm to 3 nm, such as 1 nm to 2 nm. In one embodiment, the SAF structure 120 can include a vertical stack including at least one superlattice 112 and an antiferromagnetic coupling layer 114 located between the reference layer 132 and the at least one superlattice 112. In one embodiment, the at least one superlattice 112 may comprise a first superlattice and a second superlattice. The antiferromagnetic layer 114 may comprise an Ir or an IrMn alloy layer located between the first and the second superlattices. In one embodiment, the first superlattice comprises N1 repetitions of a first unit layer stack of the first cobalt layer and the first platinum layer, and a first capping cobalt layer, such that N1 of the first platinum layers are interlaced with (N1+1) of the first cobalt layers, where N1 is an integer in a range from 2 to 10. The second superlattice comprises N2 repetitions of a second unit layer stack of the second cobalt layer and the second platinum layer, and a second capping cobalt layer, such that N2 first platinum layers are interlaced with (N2+1) second cobalt layers, where N2 is an integer in a range from 2 to 10. Other SAF structures 120 may be used. For example, a superlattice layer may be used instead of the at least one superlattice 112. The superlattice layer 112 includes a ferromagnetic material having perpendicular magnetic anisotropy. The magnetization of the reference layer 132 can be antiferromagnetically coupled to the magnetization of the superlattice layer 112.

The metallic capping layer 148, if present, can include a nonmagnetic metal layer or multilayers, such as ruthenium, tungsten and/or tantalum. The metallic capping layer 148 may be a portion of a second electrically conductive line 90, or may be an electrically conductive structure that underlies the second electrically conductive line 90.

In one embodiment, the dielectric cap layer 144 may comprise a thin magnesium oxide layer that is thin enough to enable tunneling of electrical current, such as a thickness in a range from 4 Angstroms to 10 Angstroms. In one embodiment, the MRAM cell 180 can be a single tunnel junction device that includes only one magnetic tunnel junction 130.

The layer stack including the optional seed layer 111, the optional SAF structure 120, the magnetic tunnel junction 130, the optional dielectric cap layer 144 and the optional metallic capping layer 148 comprises a MRAM pillar 100. According to an aspect of the present disclosure, a carbon-based layer 110 can be provided between the first electrically conductive line 30 and the MRAM pillar 100. The carbon-based layer 110 may contact both the first electrically conductive line 30 (e.g., word line) and the adjacent layer of the MRAM stack 100. For example, the carbon-based layer 110 may contact the seed layer 111 (if present), the SAF structure 120 (if present and the seed layer 111 is omitted) or a layer of the magnetic tunnel junction 130 (e.g., the reference layer 132 or the free layer 136) if the seed layer 111 and the SAF structure 120 are omitted or formed on the opposite side of the magnetic tunnel junction 130 from the carbon-based layer 110.

The carbon-based layer 110 comprises a carbon-based material. As used herein, a carbon-based material refers to a material including carbon at an atomic percentage greater than 50%. The carbon-based material of carbon-based layer 110 may comprise carbon at an atomic percentage between 50% and 100%, such as greater than 60%, and/or greater than 70%, and/or greater than 80%, and/or greater than 90%, and/or greater than 95%, and/or greater than 98%, and/or greater than 99.5%. The carbon-based material may comprise, and/or may consist essentially of, amorphous carbon, diamond-like carbon (DLC), a carbon-semiconductor alloy including at least one semiconductor element such as silicon and/or germanium, a carbon-nitrogen alloy, a carbon-boron alloy, or a carbon-boron-nitrogen alloy. The carbon-based layer 110 reduces the topography of the surface of the first electrically conductive line 90 and a surrounding dielectric material layer, and facilitates uniform film property for the various material layers of the MRAM pillar 100.

In one embodiment, a selector element 150 can be formed in a series connection with the MRAM pillar 100 containing the magnetic tunnel junction 130. The selector element 150 and the carbon-based layer 110 may be located on the opposite sides of the MRAM pillar 100. The selector element 150 includes a selector material that provides a bidirectional current flow when the current or voltage exceeds a threshold value. Thus, the selector element 150 is a bidirectional selector device which permits bidirectional current flow when the current or voltage exceeds a threshold value and blocks current flow when the current or voltage is below the threshold value. The selector element 150 may include an ovonic threshold switch (OTS) material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si.

The selector element 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

The layer stack including the selector element 150, the SAF structure 120, the magnetic tunnel junction 130, the dielectric cap layer 144 and the metallic capping layer 148 can be annealed to induce crystallographic alignment between the crystalline structure of the nonmagnetic tunnel barrier layer 134 (which may include crystalline MgO having a rock salt crystal structure) and the crystalline structure within the free layer 136.

An electrically conductive plate 160 may be optionally provided between the selector element 150 and the second electrically conductive line 90. The electrically conductive plate 160 may comprise a nonmagnetic conductive material, such as Ta and/or Pt.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the magnetic tunnel junction 130.

Figure 3A:
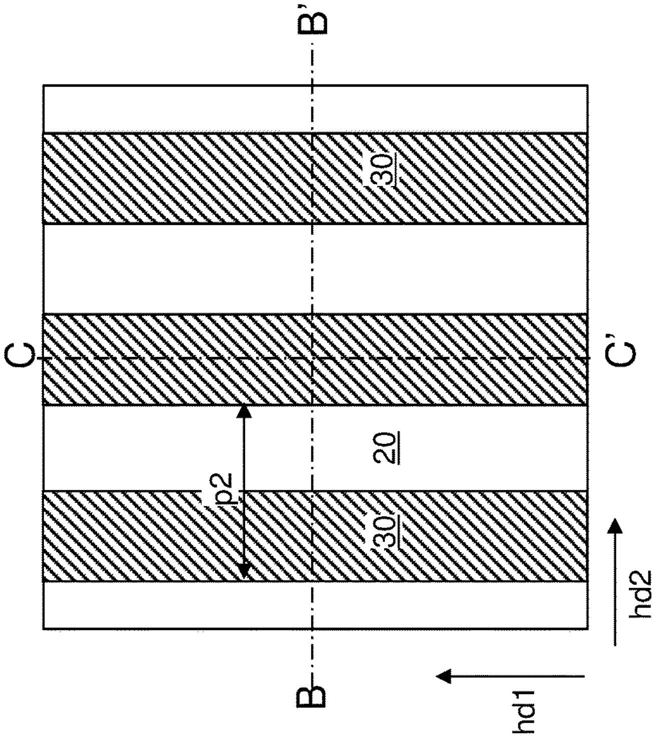
FIGS. 3A-3C are various views of an exemplary structure after formation of a first line-level dielectric layer and first electrically conductive lines according to an embodiment of the present disclosure.
Figure 3B:
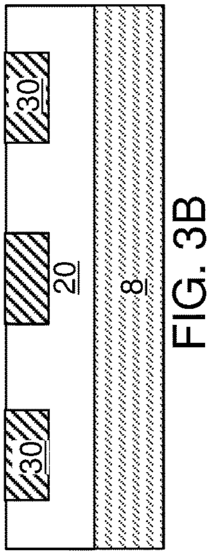
Figure 3C:
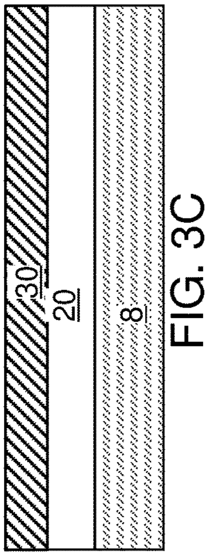

Referring to FIGS. 3A-3C, an exemplary structure for forming a two-dimensional array of STT MRAM cells 180 is illustrated. The exemplary structure can be provided by forming a layer stack of blanket (unpatterned) layers over a substrate 8. The substrate 8 may comprise, for example, a semiconductor substrate and at least one dielectric material layer formed over the semiconductor substrate. Alternatively, an insulating substrate (e.g., a ceramic or a glass substrate) or a conductive substrate 8 (e.g., a metal or metal alloy substrate) may be used for the substrate 8. In one embodiment, various semiconductor devices (not shown) including switching devices (such as field effect transistors) of peripheral (i.e., driver) circuits may be formed over the semiconductor substrate, and metal interconnect structures (not shown) may be formed in the at least one dielectric material layer. The various semiconductor devices, if present, may comprise the various driver circuits of the MRAM device 500 illustrated in FIG. 1 other than the memory array region 550, which is subsequently formed in subsequent processing steps.

A combination of a first line-level dielectric layer 20 and first electrically conductive lines (e.g., word lines) 30 can be formed over the substrate. In one embodiment, the first line-level dielectric layer 20 comprises an inter-level dielectric (ILD) material, such as silicon oxide, silicon nitride, silicon carbide-nitride, silicon oxynitride, organosilicate glass, etc. The first electrically conductive lines 30 can be formed in an upper portion of the first line-level dielectric layer 20. The first electrically conductive lines 30 include a first nonmagnetic electrically conductive material such as Al, Cu, W, Ru, Mo, Nb, Ti, Ta, TiN, TaN, WN, MON, or a combination thereof. The thickness of the first electrically conductive lines 30 can be in a range from 20 nm to 100 nm, although lesser and greater thicknesses can also be employed.

Generally, the first electrically conductive lines 30 can laterally extend along a horizontal direction, and can be laterally spaced apart from each other. The direction along which the first electrically conductive lines 30 laterally extend is herein referred to as first horizontal direction hd1. The direction along which the second electrically conductive lines 30 are laterally spaced apart is herein referred to as a second horizontal direction hd2. In one embodiment, the first electrically conductive lines 30 may be arranged as a one-dimensional periodic array arranged along the second horizontal direction hd2 with a periodicity, which is herein referred to as a second pitch p2. The second pitch p2 may be in a range from 10 nm to 300 nm, such as from 30 nm to 100 nm, although lesser and greater dimensions may also be employed for the second pitch p2. Generally, the first electrically conductive lines 30 are embedded in the first line-level dielectric layer 20 that is located over a substrate 8.

The first electrically conductive lines 30 may be formed by a damascene method (for example, by forming trenches in an upper portion of the first line-level dielectric layer 20 and filling the trenches with a conductive material), or by depositing and patterning a metallic material layer into metal line patterns (which are the first electrically conductive lines 30) and subsequently filling gaps between the metal line patterns with a dielectric fill material. A chemical mechanical polishing (CMP) process may be employed so that the top surfaces of the first electrically conductive lines 30 and the top surface of the first line-level dielectric layer 20 are formed at approximately the same level. Generally, some topographic variations (i.e., differences in the height) can be present between the top surfaces of the first electrically conductive lines 30 and the top surface of the first line-level dielectric layer 20, which are difficult to remove by CMP.

Referring to FIGS. 4A-4E, a continuous carbon-based layer 110L, an optional continuous metallic seed layer 111L, magnetic tunnel junction-level (MTJ-level) material layers (112L, 114L, 130L, 144L, 148L) (i.e., the layers (111L, 112L, 114L, 130L, 144L, 148L) of the MRAM pillar 100), an optional first image transfer assist layer 273L, an optional patterning film 276L, an optional second image transfer assist layer 277L, and a first patterned photoresist layer 337 including first etch mask patterns can be formed over the first line-level dielectric layer 20 and the first electrically conductive lines 30.

The continuous carbon-based layer 110L is deposited over the first electrically conductive lines 30 and the first line-level dielectric layer 20. The continuous carbon-based layer 110 may be formed at an elevated temperature by a chemical vapor deposition process, a physical vapor deposition process (e.g., sputtering), or an atomic layer deposition process. The continuous carbon-based layer 110 comprises a carbon-based material including carbon atoms at an atomic percentage greater than 50%. The carbon-based material may comprise, and/or may consist essentially of, amorphous carbon, diamond-like carbon (DLC), a carbon-semiconductor alloy including at least one semiconductor element such as silicon and/or germanium, a carbon-nitrogen alloy, a carbon-boron alloy, or a carbon-boron-nitrogen alloy.

In one embodiment, the continuous carbon-based layer 110L may be subjected to a partial sputter etch process to increase the planarity of its top surface. The sputter etch process may comprise an inert gas, such as an argon sputter process, in which energetic argon atoms may impinge along a vertical direction and remove a top portion of the continuous carbon-based layer. According to an aspect of the present disclosure, the sputter etch process etches protruding portions of a top surface of the continuous carbon-based layer at a higher sputter rate than planar portions of the top surface of the continuous carbon-based layer that are recessed relative to the protruding portions, and increases planarity of the top surface of the remaining portion of the continuous carbon-based layer 110L. The sputter etch process has a net effect of providing a planarized top surface in a remaining portion of the continuous carbon-based layer 110L. Without wishing to be bound by a particular theory, it is believed that the planarization occurs because protruding portions of the continuous carbon-based layer attracts more argon particles in the argon beam due to the enhanced electrical field caused by the topography of the protruding portions of the continuous carbon-based layer. The root-mean-square roughness of the sputtered surfaces of the continuous carbon-based layer 110L can be less than the root-mean-square roughness of the continuous carbon-based layer. For example, the root-mean-square roughness of the sputter etched surfaces of the continuous carbon-based layer 110L may be in a range from 30% to 90%, such as from 50% to 80%, of the root-mean-square roughness of the continuous carbon-based layer prior to the sputter etch process. In one embodiment, the continuous carbon-based layer 110L may comprise argon atoms (from the sputter etching) at an atomic concentration in a range from 0.1% to 5%, such as from 0.3% to 3%, although lower and higher atomic concentration of argon atomic may also be employed.

The final thickness of the continuous carbon-based layer 110 may be 10 nm or less, such as from 1 nm to 10 nm, such as from 2 nm to 5 nm, although lesser and greater thicknesses may also be employed. Generally, the continuous carbon-based layer 110L reduces the topography of the underlying top surface of the first electrically conductive lines 30 and first line-level dielectric layer 20, and facilitates uniform film thickness and uniform film property for subsequently deposited material layers, such as the continuous metallic seed layer 111L and the magnetic tunnel junction-level (MTJ-level) material layers (112L, 114L, 130L, 144L, 148L).

An optional continuous metallic seed layer 111L can be deposited over the continuous carbon-based layer 110L. The continuous metallic seed layer 111L comprises nonmagnetic metallic material that can be employed as a nucleation seed material for the metal or metal alloy layers to be subsequently formed. In one embodiment, the continuous metallic seed layer 111L may comprise, and/or may consist essentially of, a metallic material such as Ta. In one embodiment, the continuous metallic seed layer 111L may be formed by physical vapor deposition or chemical vapor deposition, and may have a thickness in a range from 0.5 nm to 3 nm, although lesser and greater thicknesses may also be employed.

The magnetic tunnel junction-level (MTJ-level) material layers (112L, 114L, 130L, 144L, 148L) can be formed over the optional continuous metallic seed layer 111L and the continuous carbon-based layer 110L. The MTJ-level material layers (112L, 114L, 130L, 144L, 148L) may comprise, for example, an optional continuous superlattice layer 112L, an optional continuous antiferromagnetic coupling layer 114L, continuous magnetic tunnel junction (MTJ) material layers 130L, an optional continuous dielectric capping layer 144L, and an optional continuous metallic capping layer 148L. The MTJ material layers 130L may comprises a layer stack including a continuous reference layer 132L, a continuous nonmagnetic tunnel barrier layer 134L, a continuous free layer 136L.

The continuous superlattice layer 112L can have the same material composition as the superlattice layer 112 described with reference to FIG. 2. The continuous antiferromagnetic coupling layer 114L, if present, can have the same material composition as the antiferromagnetic coupling layer 114 described with reference to FIG. 2. In one embodiment, the continuous antiferromagnetic coupling layer 114 may comprise ruthenium, iridium, or IrMn alloy, and may have thickness in a range from 0.1 nm to 1.0 nm, such as from 0.2 nm to 0.6 nm.

The continuous reference layer 132L can have the same material composition as the reference layer 132 described with reference to FIG. 2. In one embodiment, the continuous reference layer 132L can include a CoFe alloy or a CoFeB alloy. Optionally, the continuous reference layer 132L may additionally include a thin non-magnetic layer comprised of tantalum or tungsten having a thickness of 0.2 nm~0.5 nm and a thin CoFeB layer having a thickness in a range from 0.5 nm to 3 nm.

The continuous nonmagnetic tunnel barrier layer 134L includes any insulating tunnel barrier material, such as magnesium oxide. The thickness of the continuous nonmagnetic tunnel barrier layer 134L can be 0.7 nm to 1.3 nm, such as about 1 nm.

The continuous free layer 136L can have the same material composition as the free layer 136 described with reference to FIG. 2. In one embodiment, the continuous free layer 136L can include a CoFe alloy or a CoFeB alloy. Optionally, the continuous free layer 136L may additionally include a thin non-magnetic layer comprised of tantalum or tungsten having a thickness of 0.2 nm~0.5 nm and a thin CoFeB layer having a thickness in a range from 0.5 nm to 3 nm.

The continuous dielectric capping layer 144L can have the same material composition as the dielectric capping layer 144 described with reference to FIG. 2. The continuous dielectric capping layer 144L may comprise a thin magnesium oxide layer that is thin enough to enable tunneling of electrical current, such as a thickness in a range from 0.4 nm to 1 nm.

The continuous metallic capping layer 148L can have the same material composition as the metallic capping layer 144 described with reference to FIG. 2. The continuous metallic capping layer 148L may comprise a non-magnetic, electrically conductive material, such as W, Ti, Ta, WN, TiN, TaN, Ru, and Cu. The thickness of the continuous metallic capping layer 148L can be in a range from 10 nm to 100 nm, although lesser and greater thicknesses can also be employed.

The optional first image transfer assist layer 273L includes a material that can provide a high etch resistance for an anisotropic etch process to be subsequently employed with respect to the materials of the underlying layers, thereby providing a high etch selectivity for the etch process that patterns the underlying layers. For example, the optional first image transfer assist layer 273L may comprise a metal such as TIN, TaN, WN, Ti, Ta, W, Cr, Pt, or Ru. For example, the first image transfer assist layer 273L may comprise a bilayer comprising a lower TiN sublayer and an upper Ru or Pt protective sublayer. The thickness of the first image transfer assist layer 273L may be in a range from 1 nm to 30 nm, such as from 2 nm to 10 nm, although lesser and greater thicknesses may also be employed.

The optional patterning film 276L comprises a carbon-based material that can enhance pattern fidelity during subsequent anisotropic etch processes. For example, the patterning film 276L may be composed primarily of amorphous carbon or diamond-like carbon.

The optional second image transfer assist layer 277L, if present, includes a material that can provide a high etch resistance for an anisotropic etch process to be subsequently employed with respect to the material of the patterning film 276L. For example, the optional second image transfer assist layer 277L may comprise a metal such as Cr or Ru. The thickness of the second image transfer assist layer 277L may be in a range from 1 nm to 30 nm, such as from 2 nm to 10 nm, although lesser and greater thicknesses may also be employed.

A photoresist layer can be applied over the optional patterning film 276L and the optional first and second image transfer assist layers (273L, 277L), and can be lithographically patterned to form a first patterned photoresist layer 337. In one embodiment, the second patterned photoresist layer 337 may be formed as a two-dimensional periodic of discrete patterned photoresist portions having a first pitch p1 along the first horizontal direction hd1 and having the second pitch p2 along the second horizontal direction hd2. The first pitch p1 may be in a range from 10 nm to 300 nm, such as from 30 nm to 100 nm, although lesser and greater dimensions may also be employed for the first pitch p1. The second pitch p2 may be in a range from 10 nm to 300 nm, such as from 30 nm to 100 nm, although lesser and greater dimensions may also be employed for the second pitch p2. Each discrete patterned photoresist portion of the first patterned photoresist layer 337 may have a horizontal cross-sectional shape of a circle, an oval, a rectangle, a rounded rectangle, etc.

Figure 4A:
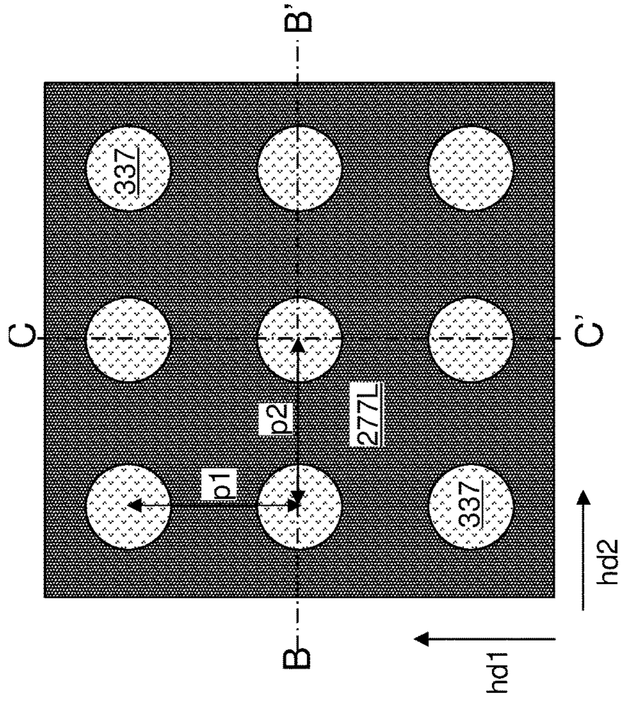
FIGS. 4A-4E are various views of the exemplary structure after formation of a continuous carbon-based layer, a continuous metallic seed layer, magnetic tunnel junction (MTJ) material layers, and first etch mask material layers according to an embodiment of the present disclosure.
Figure 4B:
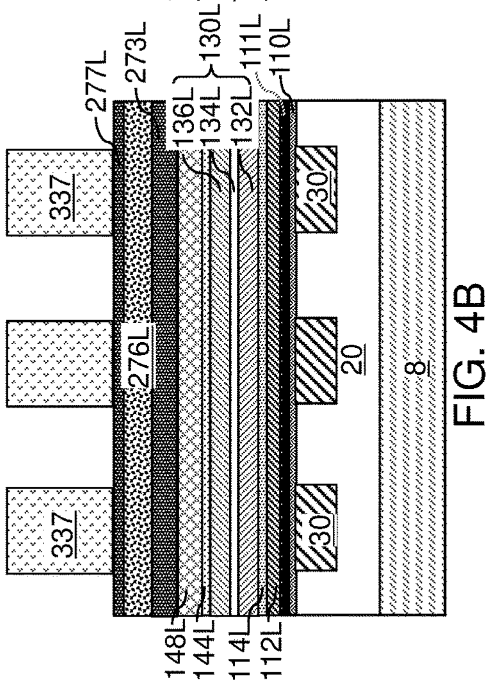
Figure 4C:
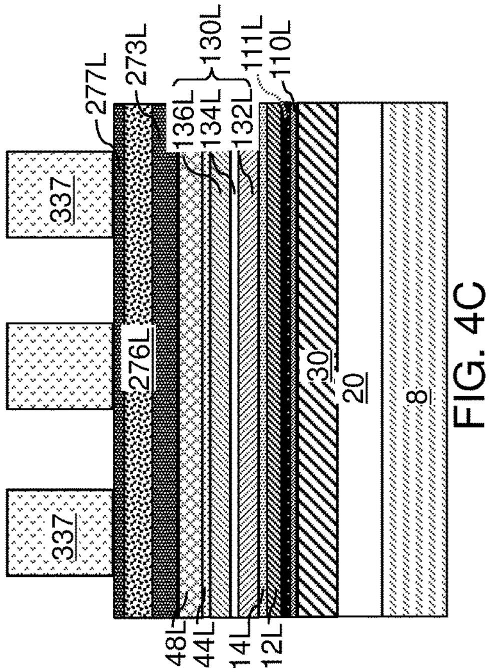
Figure 4D:
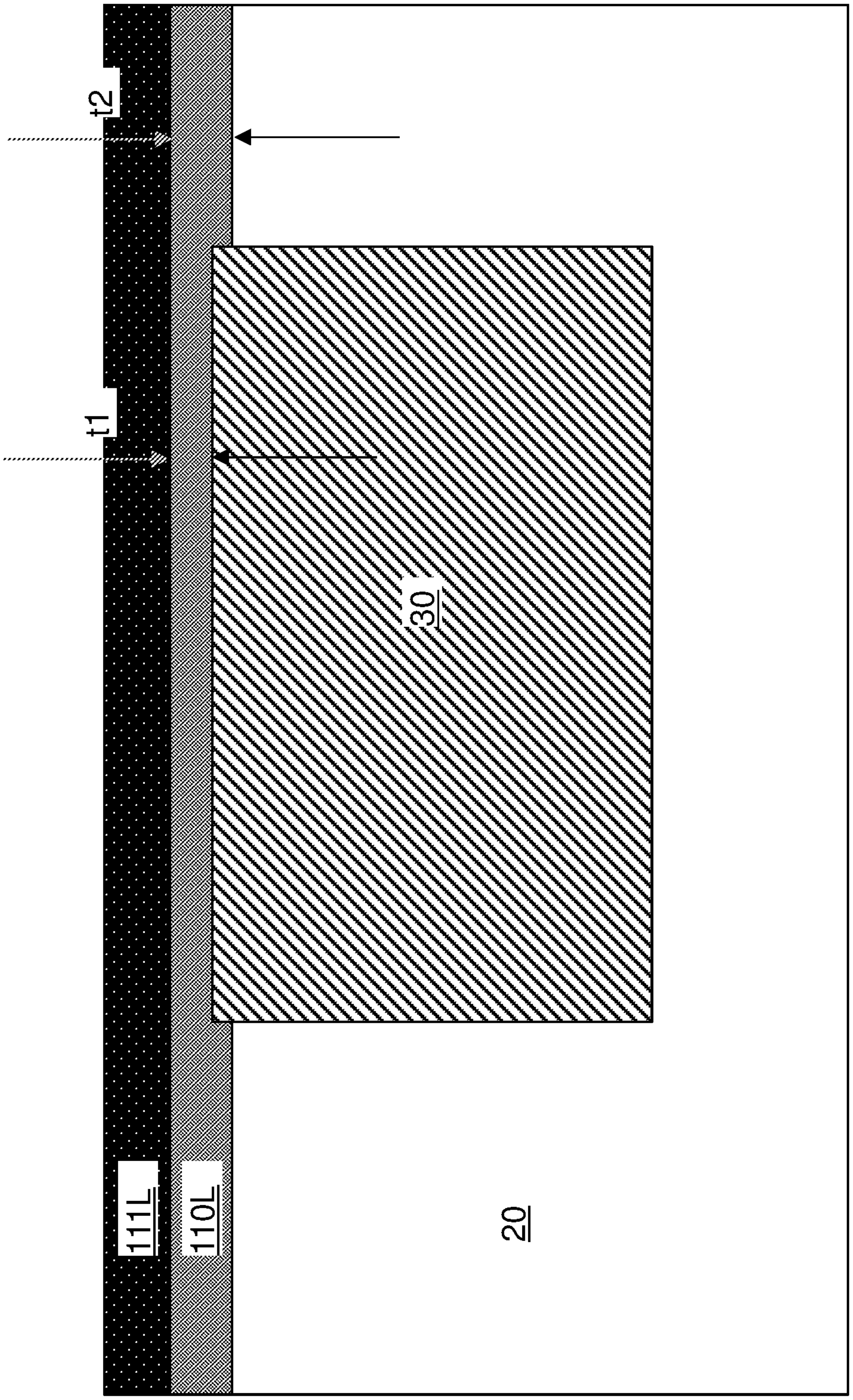

Referring to FIG. 4D, a magnified view of a first configuration of exemplary structure of FIGS. 4A-4C is illustrated, in which a top surface of a first electrically conductive line 30 protrudes above the horizontal plane including the top surface of the first line-level dielectric layer 20. In this case, the first thickness t1 of a first portion of the continuous carbon-based layer 111L that overlies the first electrically conductive layer 30 may be less than the second thickness t2 of a second portion of the continuous carbon-based layer 111L that overlies, and contacts, a top surface of the first line-level dielectric layer 20. Generally, each of the first thickness t1 and the second thickness t2 may be in a range from 1 nm to 10 nm, such as from 2 nm to 5 nm. The difference between the first thickness t1 and the second thickness t2 may be in a range from 0.2 nm to 1.5 nm, such as from 0.3 nm to 1 nm.

Figure 4E:
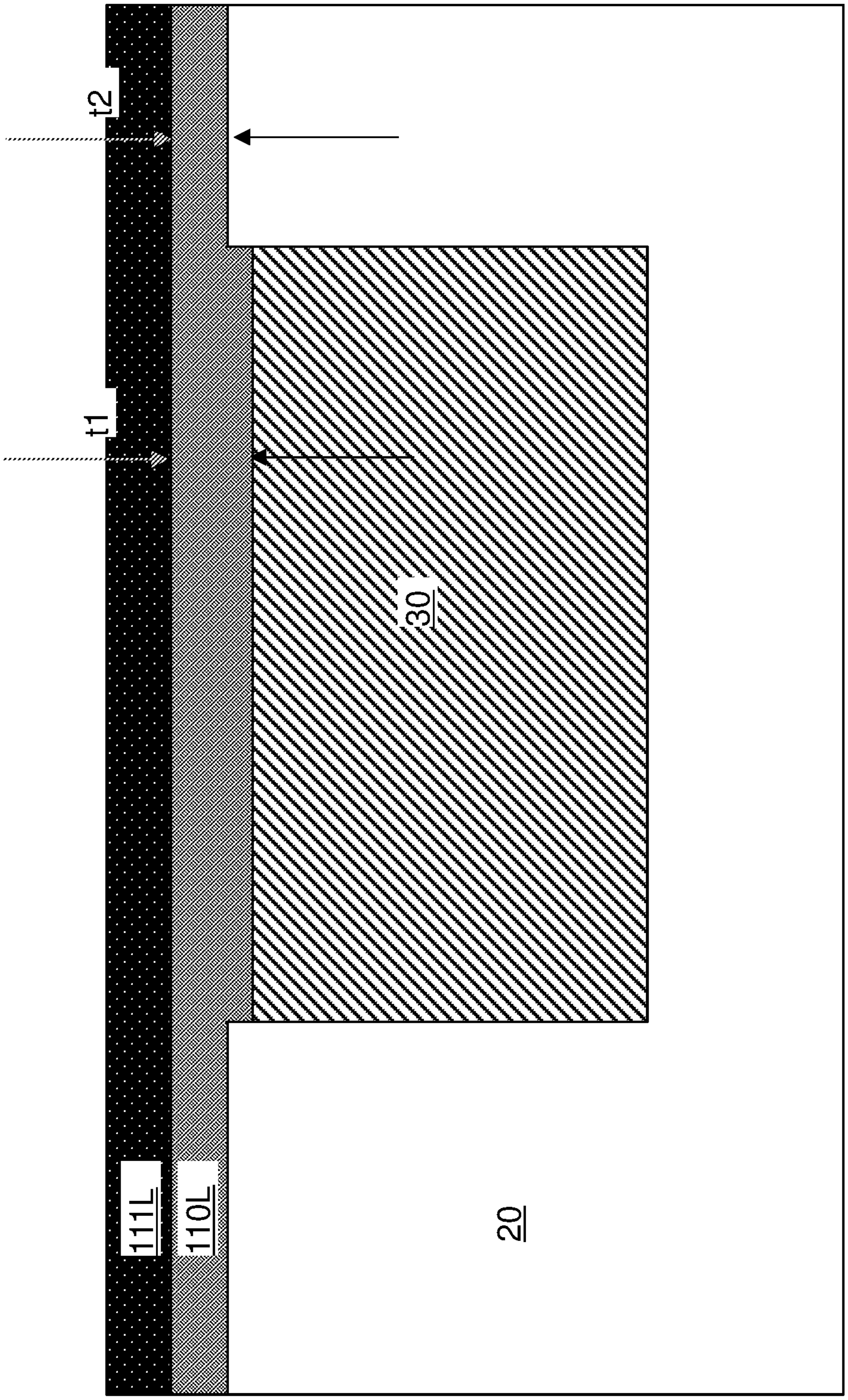

Referring to FIG. 4E, a magnified view of a second configuration of exemplary structure of FIGS. 4A-4C is illustrated, in which a top surface of a first electrically conductive line 30 is recessed below the horizontal plane including the top surface of the first line-level dielectric layer 20. In this case, the first thickness t1 of a first portion of the continuous carbon-based layer 111L that overlies the first electrically conductive layer 30 may be greater than the second thickness t2 of a second portion of the continuous carbon-based layer 111L that overlies, and contacts, a top surface of the first line-level dielectric layer 20. Generally, each of the first thickness t1 and the second thickness t2 may be in a range from 1 nm to 10 nm, such as from 2 nm to 5 nm. The difference between the first thickness t1 and the second thickness t2 may be in a range from 0.2 nm to 1.5 nm, such as from 0.3 nm to 1 nm.

Figure 5A:
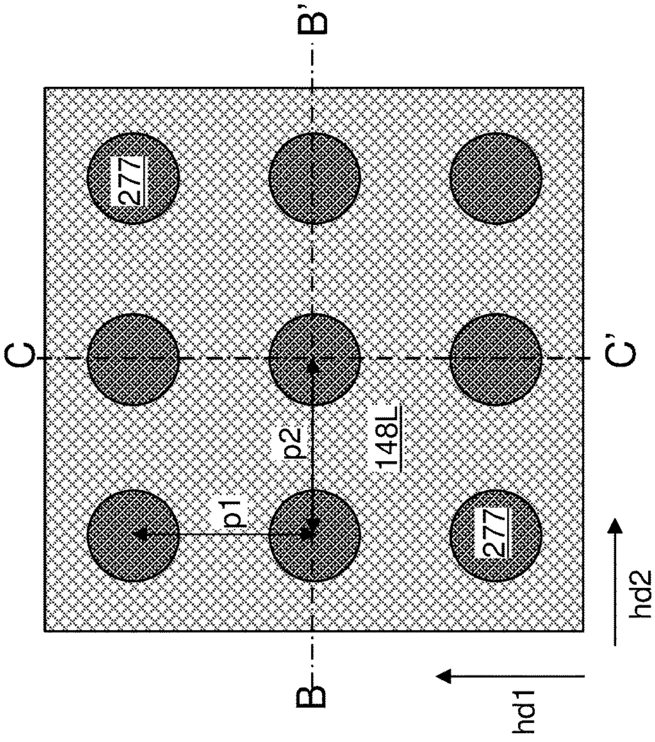
FIGS. 5A-5C are various views of the exemplary structure after patterning a two-dimensional array of first etch mask structures according to an embodiment of the present disclosure.
Figure 5B:
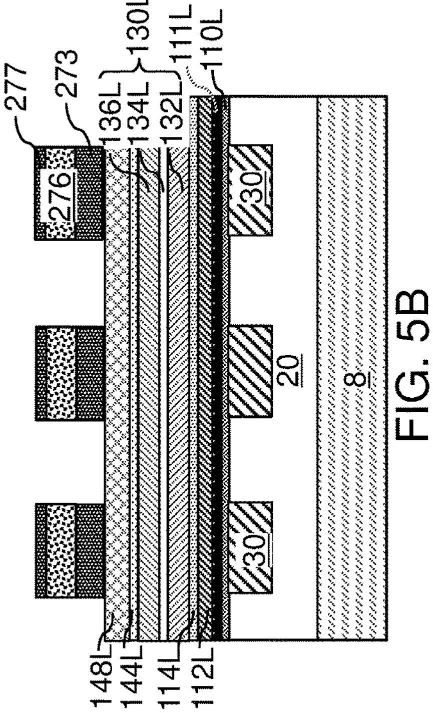
Figure 5C:
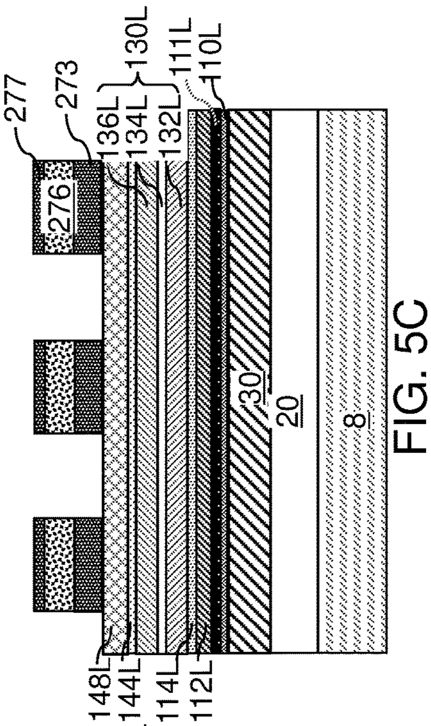

Referring to FIGS. 5A-5C, the pattern in the first patterned photoresist layer 337 can be transferred through the optional second image transfer assist layer 277L, the optional patterning film 276L, and the optional first image transfer assist layer 273L. Optional first etch mask structures (273, 276, 277) can be formed over the MTJ-level material layers (112L, 114L, 130L, 144L, 148L). Each first etch mask structure (273, 276, 277) may comprise a patterning film portion 276, a first image transfer assist material portion 273, and/or a second image transfer assist material portion 277. Each patterning film portion 276 may be a patterned portion of the patterning film 276L. Each first image transfer assist material portion 273 can be a patterned portion of the first image transfer assist layer 273L. Each second image transfer assist material portion 277 can be a patterned portion of the second image transfer assist layer 277L. The first patterned photoresist layer 337 can be subsequently removed, for example, by ashing.

Figure 6A:
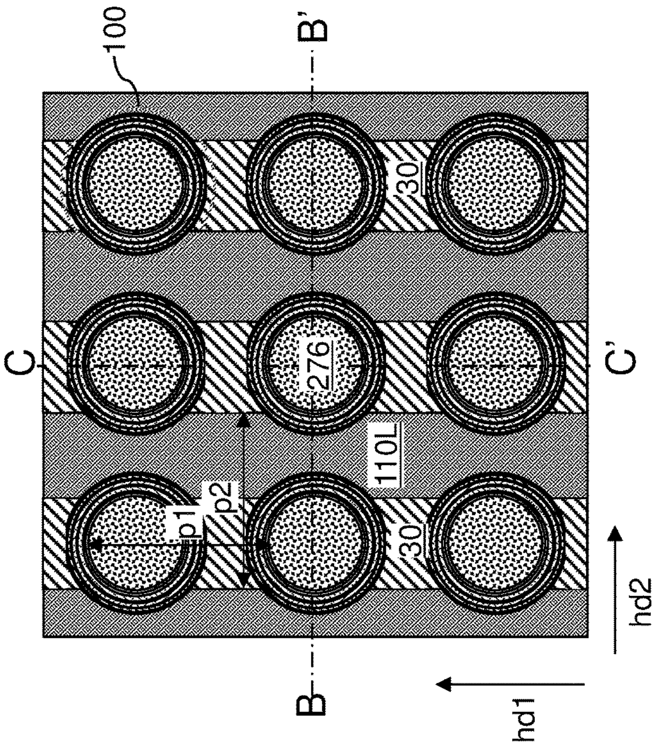
FIGS. 6A-6C are various views of the exemplary structure after patterning a two-dimensional array of MRAM pillars according to an embodiment of the present disclosure.
Figure 6B:
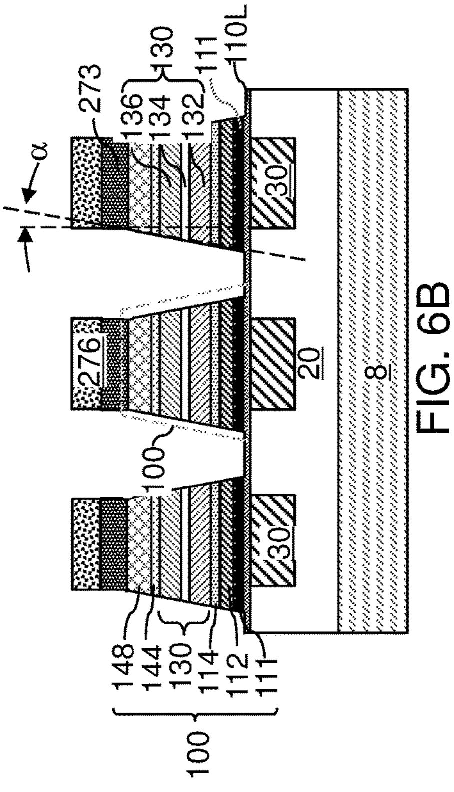
Figure 6C:
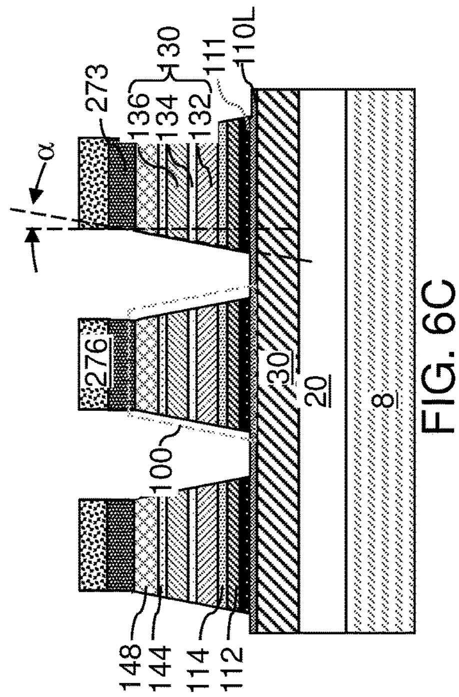

Referring to FIGS. 6A-6C, a first pattern transfer process can be performed to transfer the pattern in the first etch mask structures (273, 276, 277) through the MRAM layers comprising the MTJ-level material layers (112L, 114L, 130L, 144L, 148L) and the seed layer 111L, and optionally partly into the continuous carbon-based layer 110L which acts as an etch stop. In one embodiment, the first pattern transfer process may comprise an ion beam etch process in which the first etch mask structures (273, 276, 277) are employed as an etch mask. The ion beam etch process is also referred to as an ion beam milling process. The angles of the ion beams employed during the first ion beam etch process can be selected such that sidewalls of the patterned portions of the MTJ-level material layers (112L, 114L, 130L, 144L, 148L) are formed with a taper angle a with respect to the vertical direction. The magnitude of the tilt angle a may be in a range from 1 degree to 30 degrees, such as from 3 degrees to 10 degrees, although lesser and greater first tilt angles a may also be employed.

The patterned portions of the MTJ-level material layers (112L, 114L, 130L, 144L, 148L) and the continuous seed layer 111L can comprise a two-dimensional array of MRAM pillars 100 comprising respective magnetic tunnel junctions 130. Each magnetic tunnel junction 130 comprises a respective portion stack of a reference layer 132, a nonmagnetic tunnel barrier layer 134, and a free layer 136. Each patterned portion of the continuous metallic capping layer 148L, if employed, comprises a metallic capping layer 148. Each patterned portion of the continuous dielectric capping layer 144L, if employed, comprises a dielectric capping layer 144. Each patterned portion of the continuous antiferromagnetic coupling layer 114L, if employed, comprises an antiferromagnetic coupling layer 114. Each patterned portion of the continuous superlattice layer 112L, if employed, comprises a superlattice 112. Each patterned portion of the continuous seed layer 111L, if employed, comprises a seed layer 111. Each of the MRAM pillars 100 comprises the optional seed layer 111, the optional superlattice 112, the optional antiferromagnetic coupling layer 114, the magnetic tunnel junction 130, the optional dielectric capping layer 144 and the optional metallic capping layer 148. The first etch mask structures (273, 276, 277) may be partly or completely removed during the ion beam etch process.

Referring to FIGS. 7A-7E, a sidewall oxidation process can be performed. The oxidation process may comprise a thermal oxidation process or a plasma oxidation process. The oxidation process converts sidewalls of the two-dimensional array MRAM pillars 100 into a two-dimensional array of metal oxide spacers 237. The thickness of each metal oxide spacer 237 may vary depending on the underlying metallic material because different metallic materials have different oxidation rates. Further, the material composition of each metal oxide spacer 237 may vary along a vertical direction depending on the underlying metallic materials because each portion of a metal oxide spacer 237 is formed by oxidation of an underlying surface portion of the various metal layers within MRAM pillar 100. Generally, the thickness of each metal oxide spacer 237 may vary between 0.1 nm to 1.5 nm, such as from 0.2 nm to 0.8 nm, although lesser and greater thicknesses may also be present.

In case the tunnel barrier layers 134 and/or the dielectric capping layers 144 comprise dielectric oxide materials (such as magnesium oxide), each metal oxide spacer 237 around a respective magnetic tunnel junction 130 may be formed as multiple portions that are vertically spaced apart. For example, a first portion of a metal oxide spacer 237 formed by oxidation of sidewalls of a free layer 136 may be vertically spaced from a second portion of the metallic oxide spacer 237 formed by oxidation of sidewalls of a reference layer 132, and from a third portion of the metallic oxide layer 237 formed by oxidation of sidewalls of a metallic capping layer 148. Generally, two-dimensional array of metal oxide spacers 237 comprises oxide of metal elements within metallic materials of the MRAM pillars 100, and has an inhomogeneous compositional profile along a vertical direction.

The oxidation process that volatilizes portions of the continuous carbon-based layer 110L that are not masked by the two-dimensional array of MRAM pillars 100. Remaining portions of the continuous carbon-based layer 110L comprises a two-dimensional array of carbon-based layers 110. In other words, the continuous carbon-based layer 110 can be patterned into a two-dimensional array of carbon-based layers 110 located below the respective MRAM pillars 100. The two-dimensional array of carbon-based layers 110 contacts segments of top surfaces of the first electrically conductive lines 30, and underlies the two-dimensional array of the MRAM pillars 100.

Figure 7A:
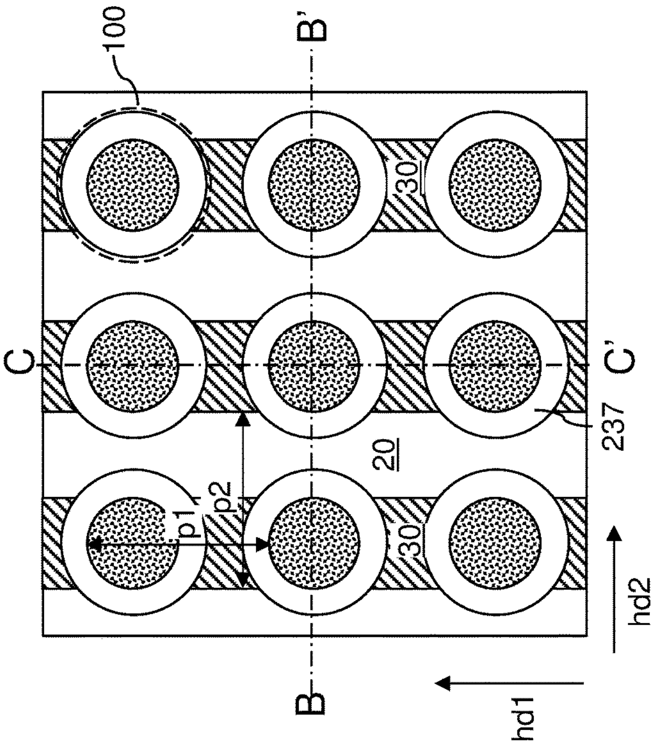
FIGS. 7A-7G are various views of the exemplary structure after formation of metal oxide spacers according to an embodiment of the present disclosure.
Figure 7B:
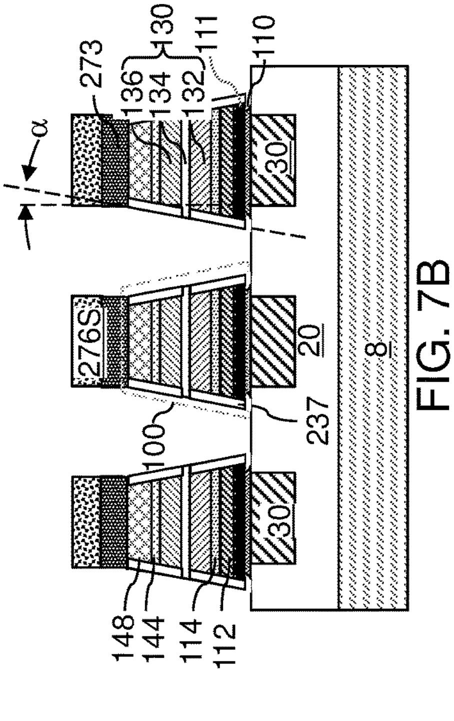
Figure 7C:
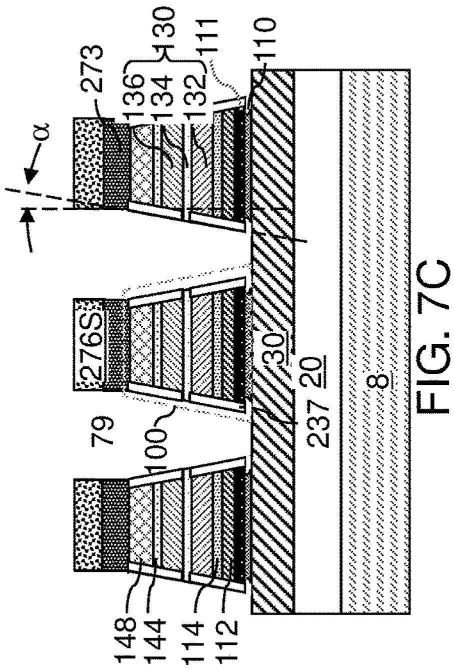
Figure 7D:
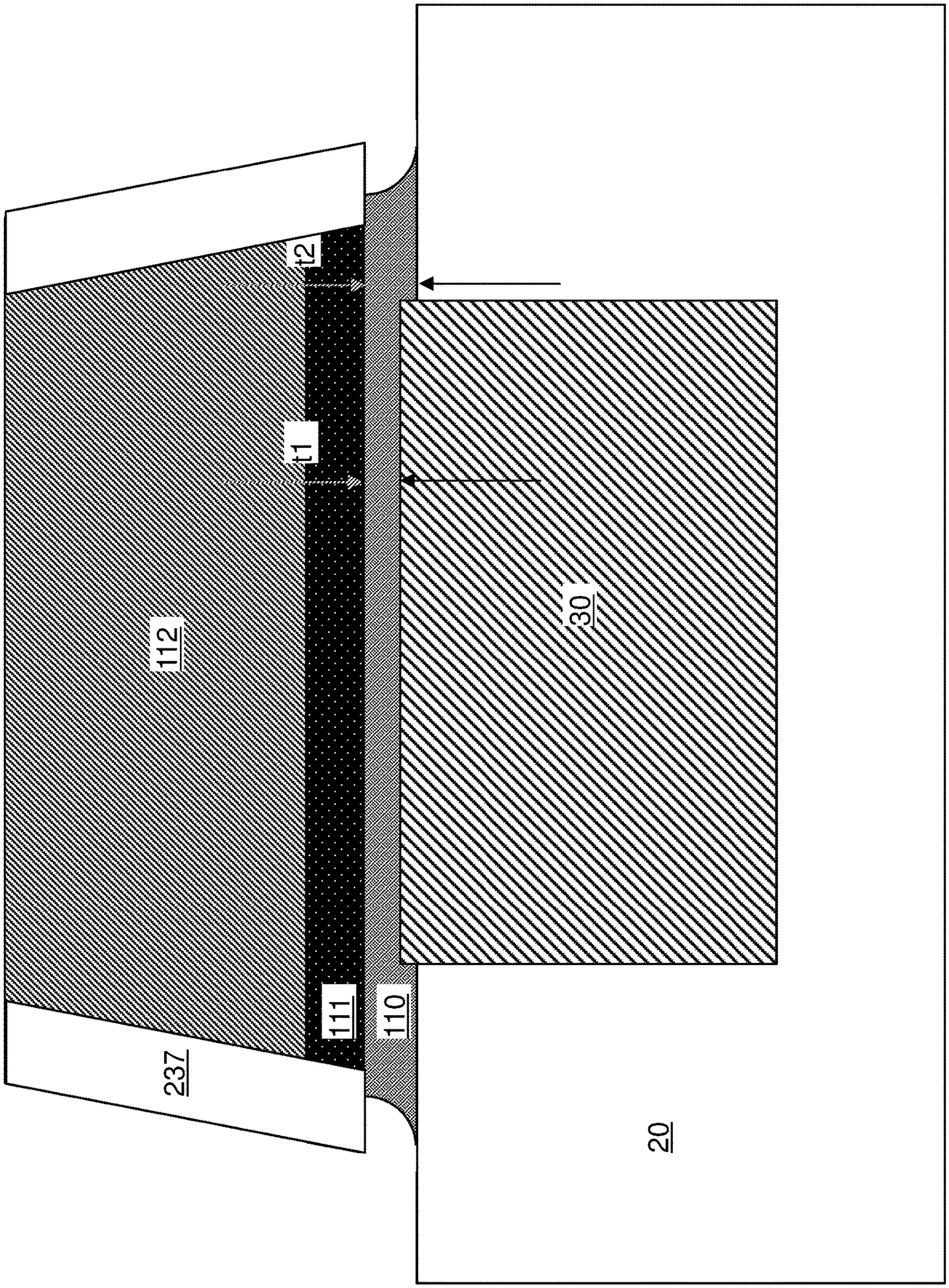
Figure 7E:
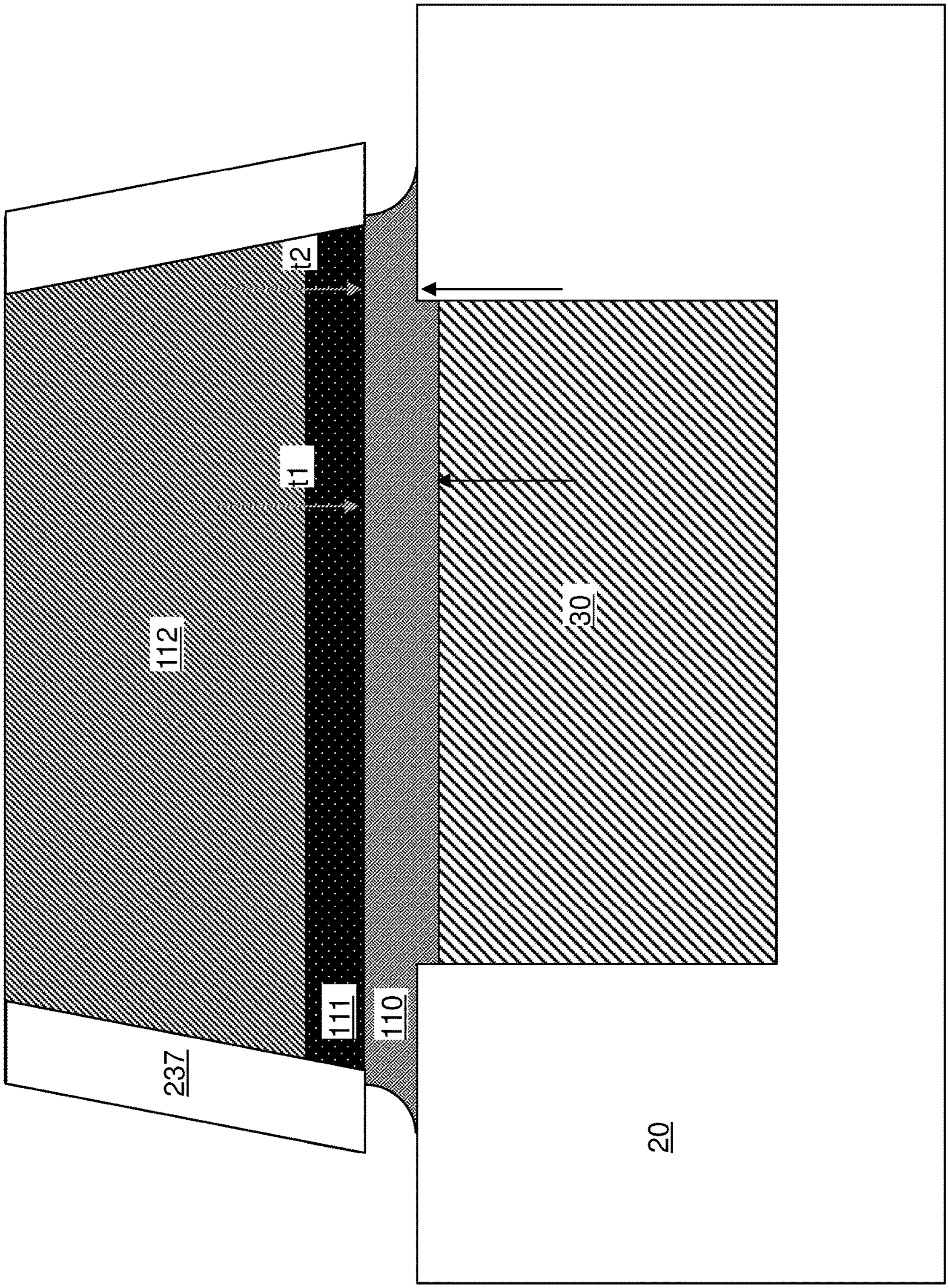
Figure 7F:
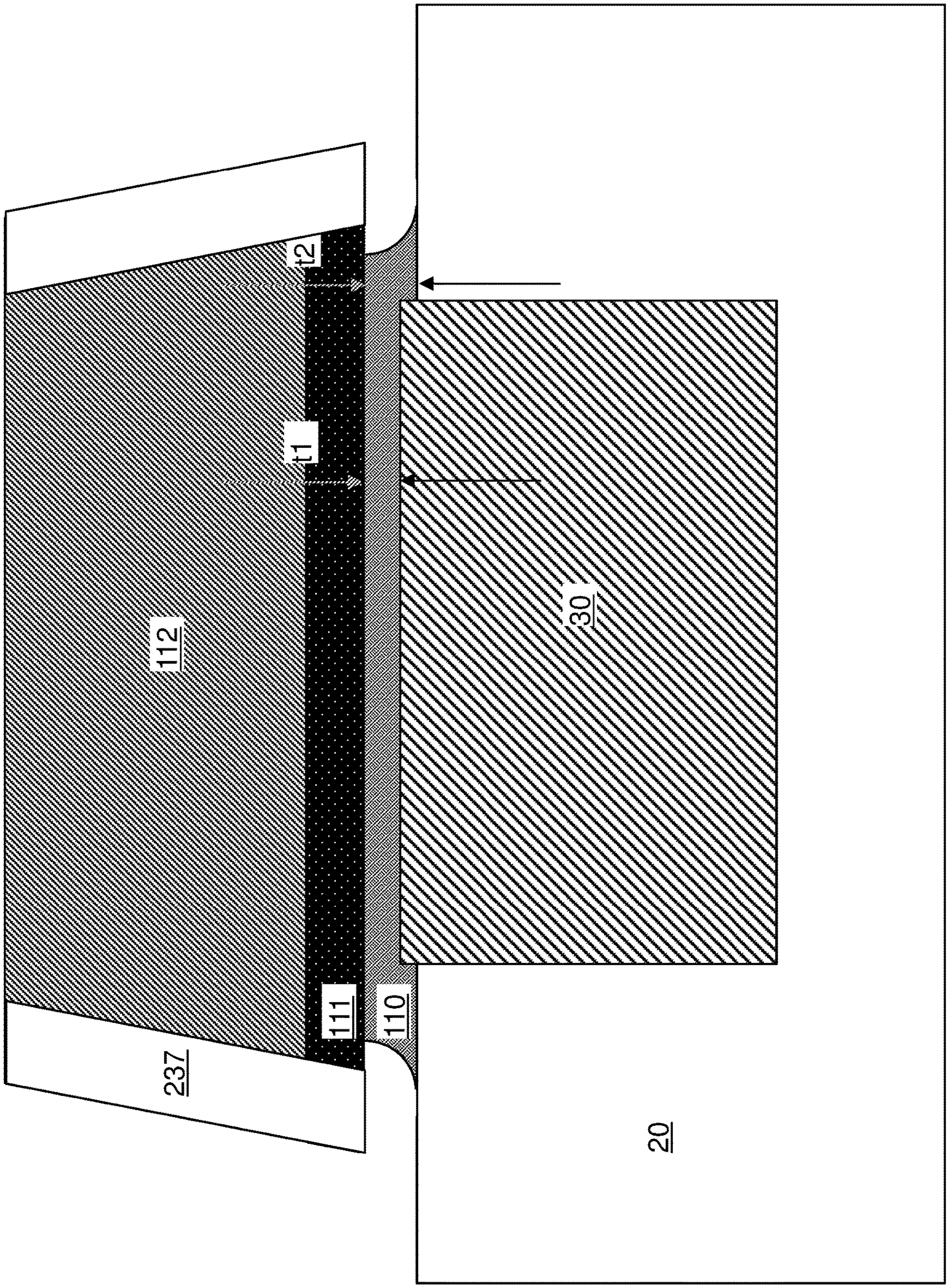
Figure 7G:
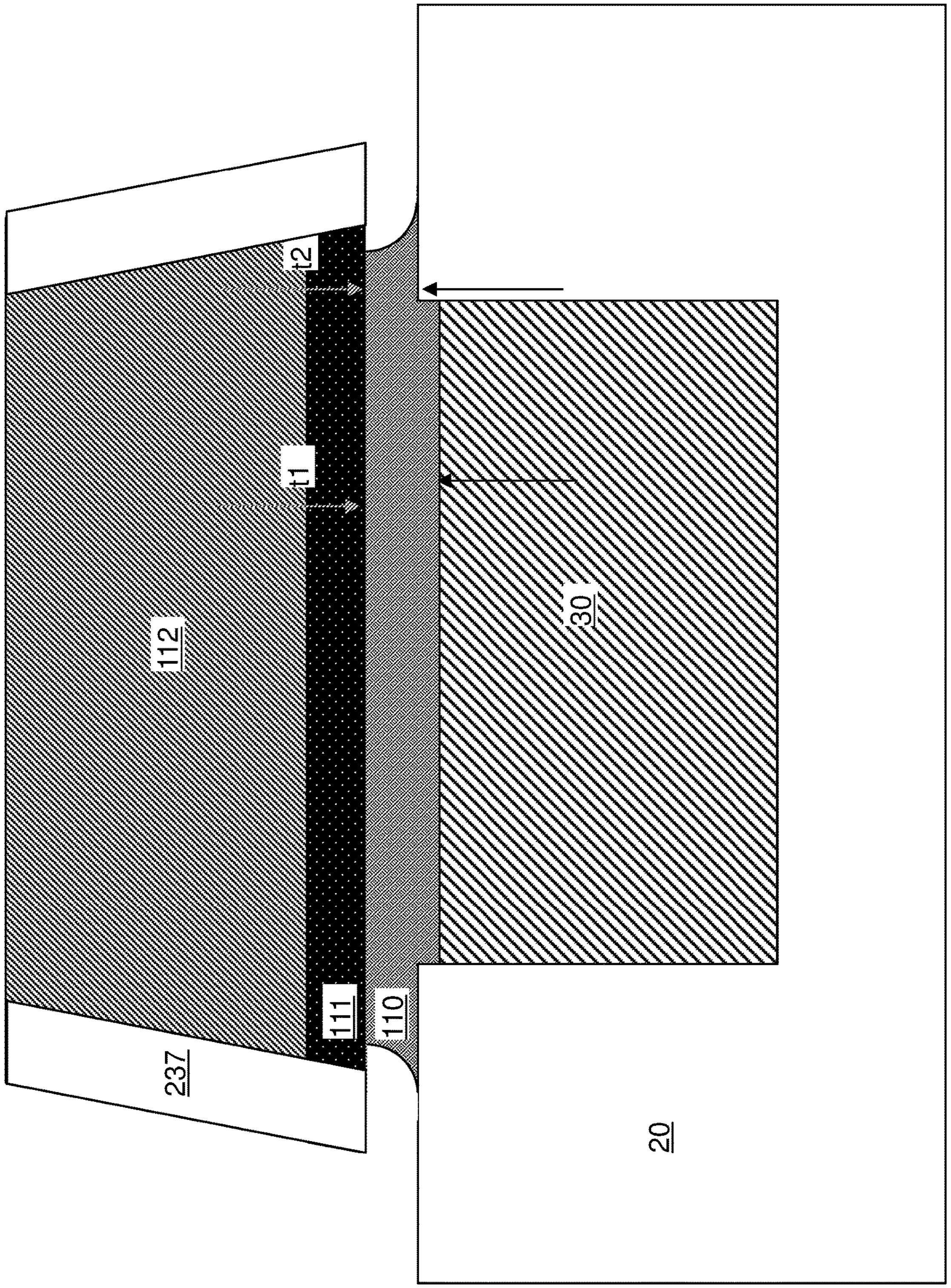

In one embodiment shown in FIGS. 7D-7G, the two-dimensional array of carbon-based layers 110 comprise bottom surface segments that contact top surface segments of the first line-level dielectric layer 20. At least one of the carbon-based layers 110 within the two-dimensional array of carbon-based layers 110 comprises a central portion in contact with a top surface of a respective underlying one of the first electrically conductive lines (e.g., word lines) 30 and having a first thickness t1, and a peripheral portion in contact with a respective one of the top surface segments of the first line-level dielectric layer 20 and having a second thickness t2 that is different from the first thickness t1. FIGS. 7D and 7F illustrate configurations in which the first thickness t1 is less than the second thickness t2. FIGS. 7E and 7G illustrate configurations in which the first thickness t1 is greater than the second thickness t2.

The two-dimensional array of metal oxide spacers 237 laterally surround the two-dimensional array of MRAM pillars 100. In some embodiments shown in FIGS. 7D and 7E, the two-dimensional array of metal oxide spacers 237 may be in contact with the two-dimensional array of carbon-based layers 110. In one embodiment, at least one of the metal oxide spacers 237 may contact a peripheral portion of a respective underlying carbon-based layer 110 as illustrated in FIGS. 7D and 7E. In one embodiment, at least one of the carbon-based layers 110 may be laterally recessed inward from a respective one of the metal oxide spacers 237, and thus, does not contact the respective one of the metal oxide spacers 237 as illustrated in FIGS. 7F and 7G.

In one embodiment, at least one carbon-based layer 110 within the two-dimensional array of carbon-based layers 110 has a respective sidewall that is laterally recessed inward from a bottom periphery of an outer sidewall of a respective overlying metal oxide spacer 237 within the two-dimensional array of metal oxide spacers 237 as illustrated in FIGS. 7D, 7E, 7F, and 7G. In one embodiment, at least one carbon-based layer 110 within the two-dimensional array of carbon-based layers 110 has a respective sidewall that protrudes outward from a bottom periphery of an inner sidewall of a respective overlying metal oxide spacer 237 within the two-dimensional array of metal oxide spacers 237 as illustrated in FIGS. 7D and 7E. In one embodiment, at least one carbon-based layer 110 within the two-dimensional array of carbon-based layers 110 has a respective sidewall that is laterally recessed inward from a bottom periphery of an outer sidewall of a respective overlying metal oxide spacer 237 within the two-dimensional array of metal oxide spacers 237 as illustrated in FIGS. 7F and 7G.

In one embodiment, the two-dimensional array of metal oxide spacers 237 is vertically spaced from, and does not contact, the first electrically conductive lines 30. The two-dimensional array of metal oxide spacers 237 may be vertically spaced from the first electrically conductive lines 30 by the two-dimensional array of carbon-based layers 110. In one embodiment, at least one carbon-based layer 110 within the two-dimensional array of carbon-based layers 110 comprises a respective tapered concave sidewall.

In one embodiment, the bottom surfaces of the two-dimensional array of MRAM pillars 100 contact the top surface of the respective carbon-based layer 110 within the two-dimensional array of carbon-based layers 110.

Figure 8A:
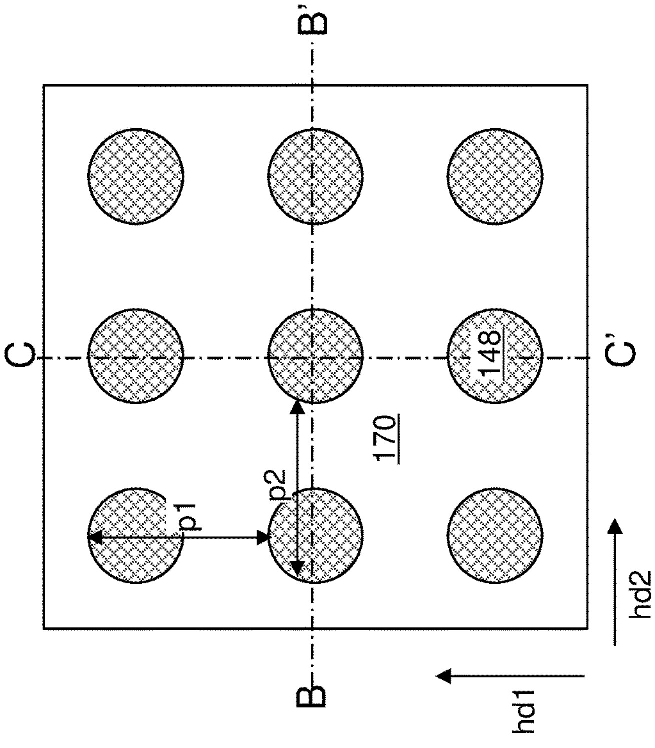
FIGS. 8A-8G are various views of the exemplary structure after formation of a junction-level dielectric material layer according to an embodiment of the present disclosure.
Figure 8B:
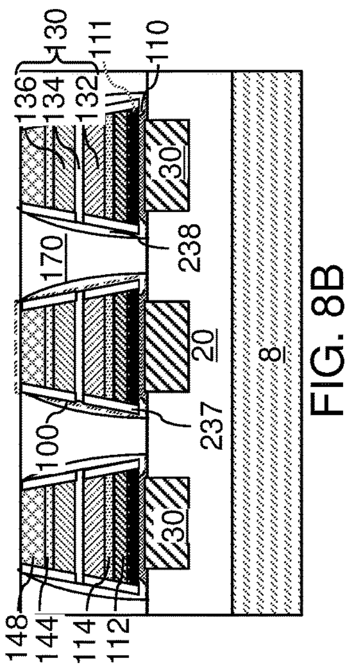
Figure 8C:
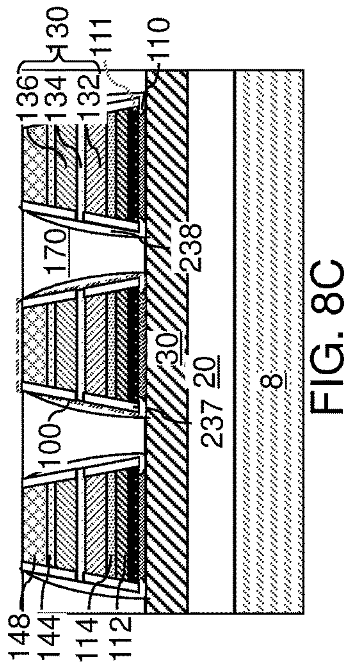
Figure 8D:
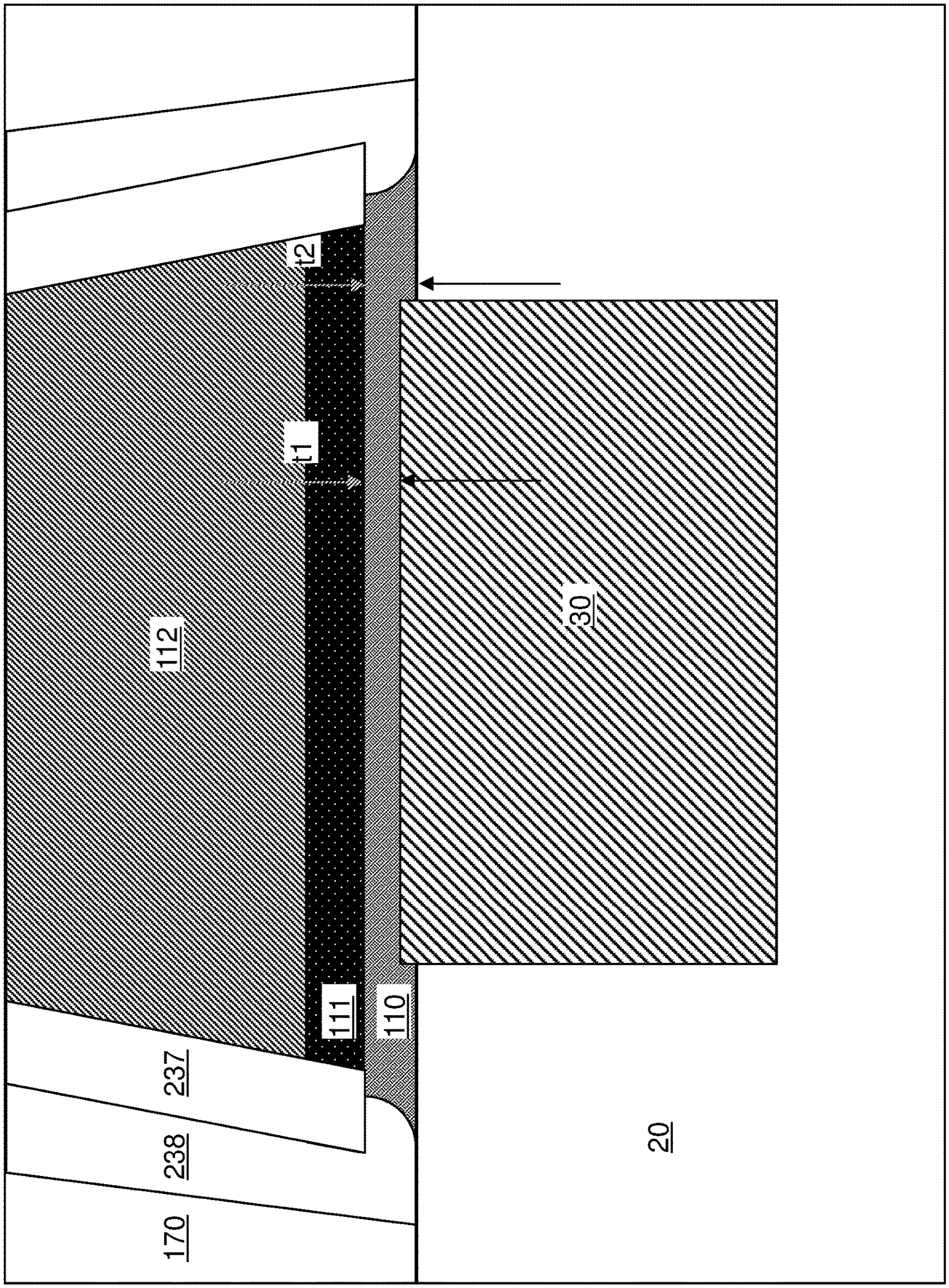
Figure 8E:
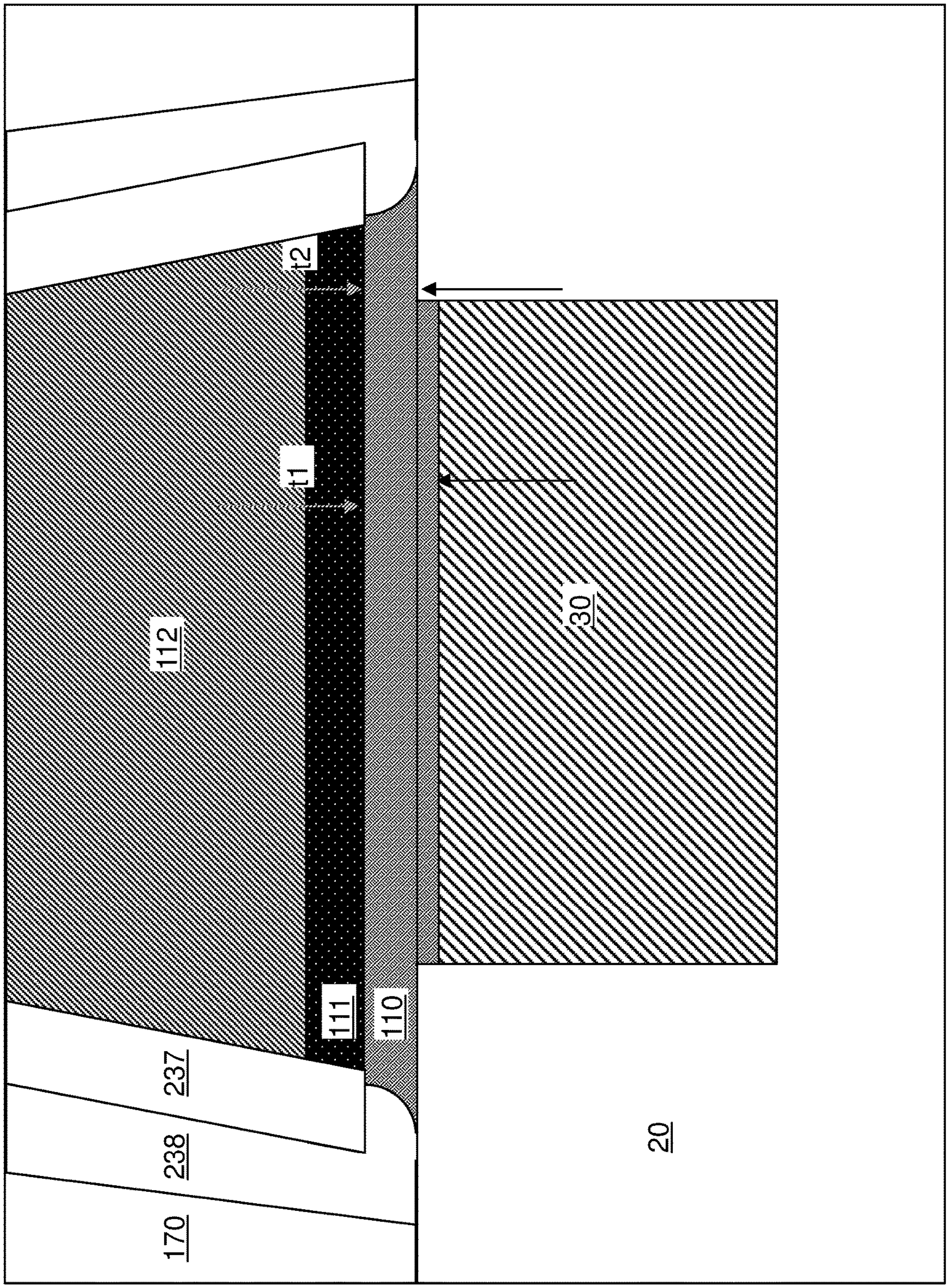
Figure 8F:
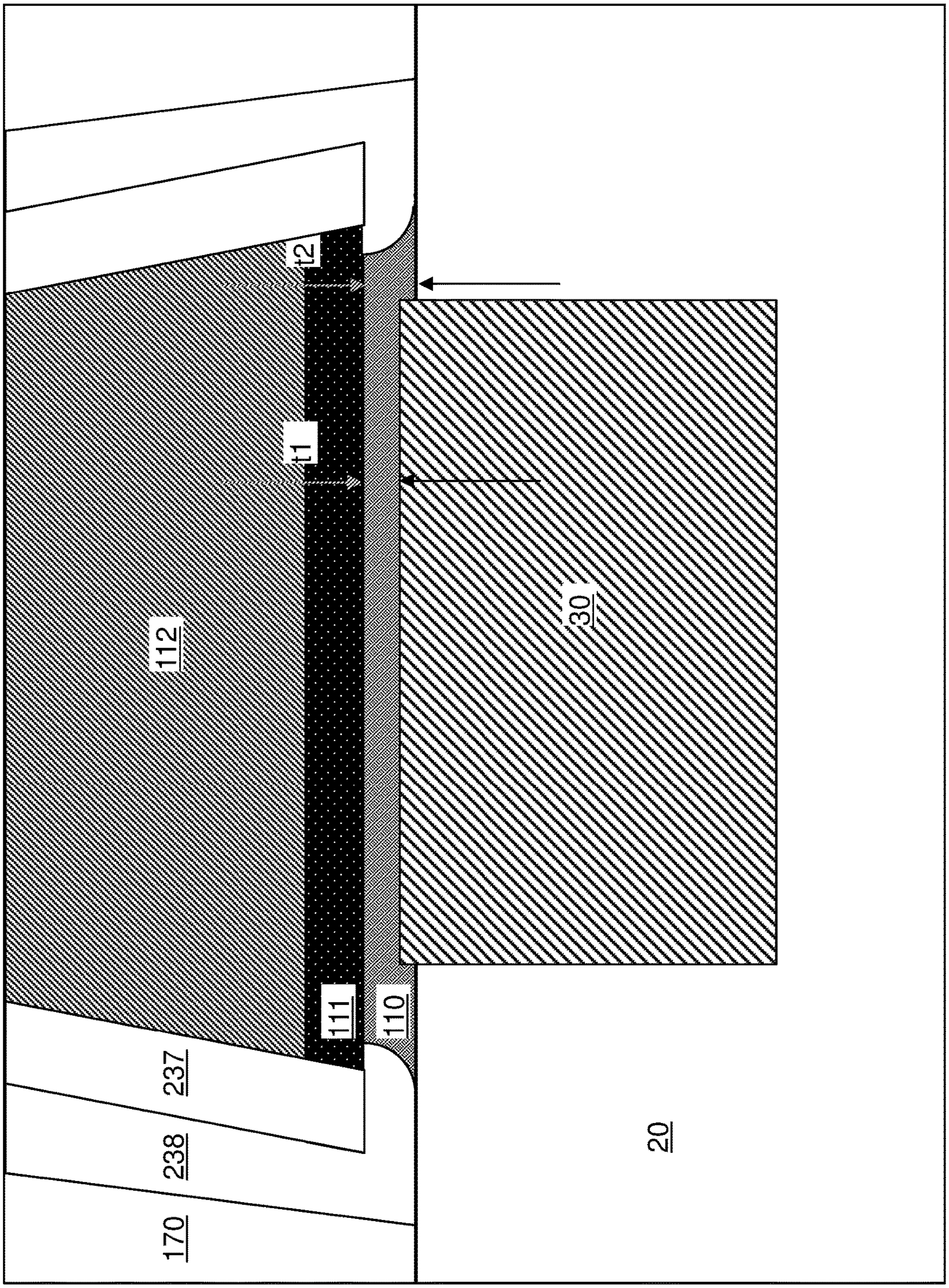
Figure 8G:
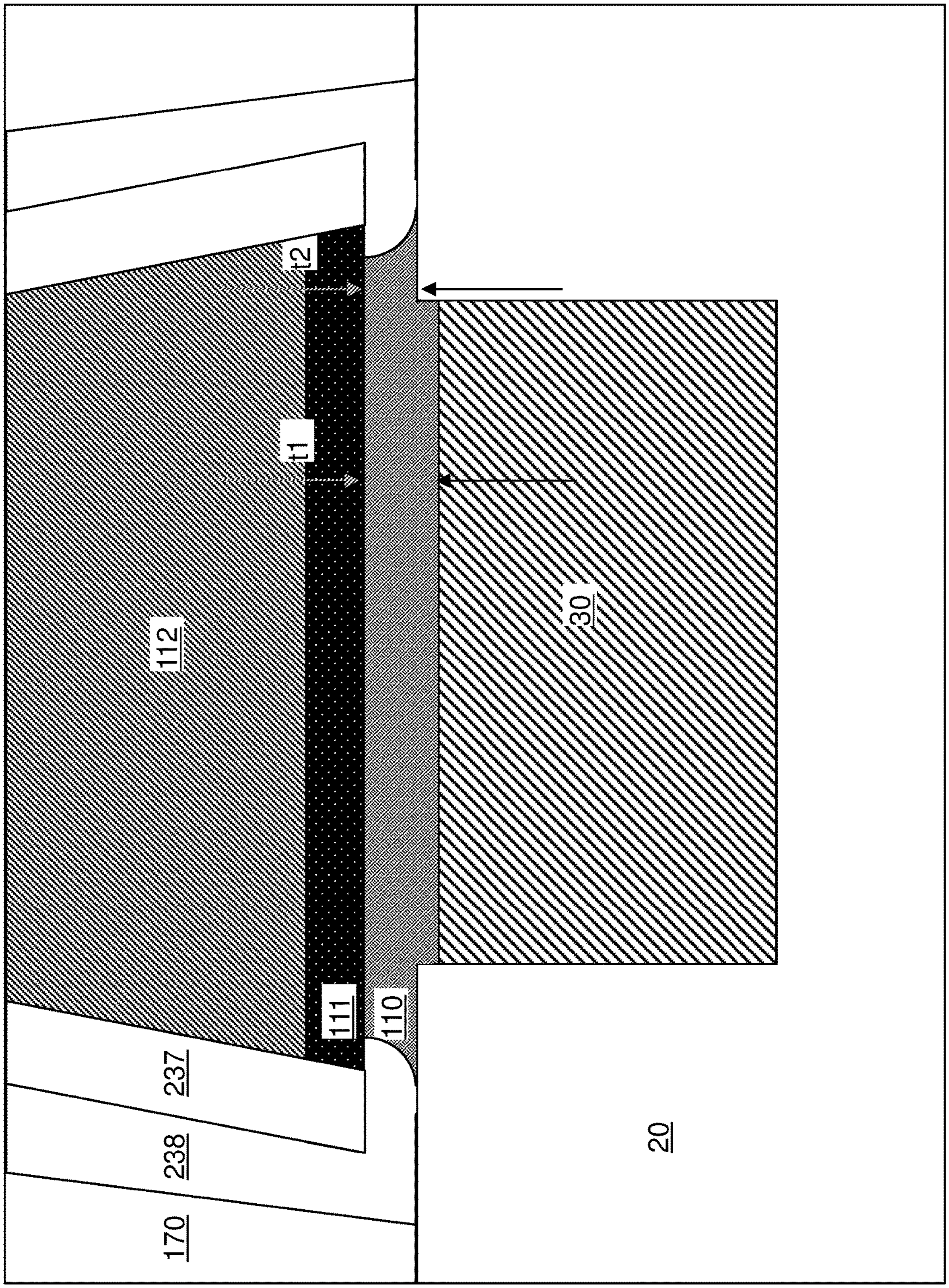

Referring to FIGS. 8A-8G, an optional dielectric material such as silicon nitride, a dielectric metal oxide, or silicon oxide can be conformally deposited over the two-dimensional array of MRAM pillars 100, and can be anisotropically etched to form a two-dimensional array of dielectric spacers 238. The dielectric spacers 238 may fill the lateral recesses underlying the two-dimensional array of metal oxide spacers 237. Depending on the lateral recess distance of the gaps (i.e., lateral divots) underlying the metal oxide spacers 237, the dielectric spacers 238 may be spaced from the metallic seed layers 111 as illustrated in FIGS. 8D and 8E, or may be in direct contact with peripheral portions of bottom surfaces of the metallic seed layers 111 as illustrated in FIGS. 8F and 8G.

Generally, a two-dimensional array of dielectric spacers 238 can be provided, each of which laterally surrounds a respective metal oxide spacer 237 within the two-dimensional array of metal oxide spacers 237. In one embodiment, at least one dielectric spacer 238 within the two-dimensional array of dielectric spacers 238 contacts a sidewall of a respective carbon-based layer 110 within the two-dimensional array of carbon-based layers 110. In one embodiment, an annular tapered convex surface of a dielectric spacer 238 may contact an annular tapered concave surface of a carbon-based layer 110.

A dielectric fill material, such as silicon oxide, can be deposited in the gaps between neighboring pairs of dielectric spacers 238 (if present) or the metal oxide spacers 237. A planarization process can be performed to remove portions of the dielectric fill material that overlie the horizontal plane including the top surfaces of the metallic capping layers 148. The remaining portion of the dielectric fill material that fill the gaps between the dielectric spacers 238 constitutes a first dielectric fill material layer, which is herein referred to as a junction-level dielectric material layer 170. The top surface of the junction-level dielectric material layer 170 may be coplanar with the top surfaces of the metallic capping layers 148.

Figures 9A, 9B, 9C:
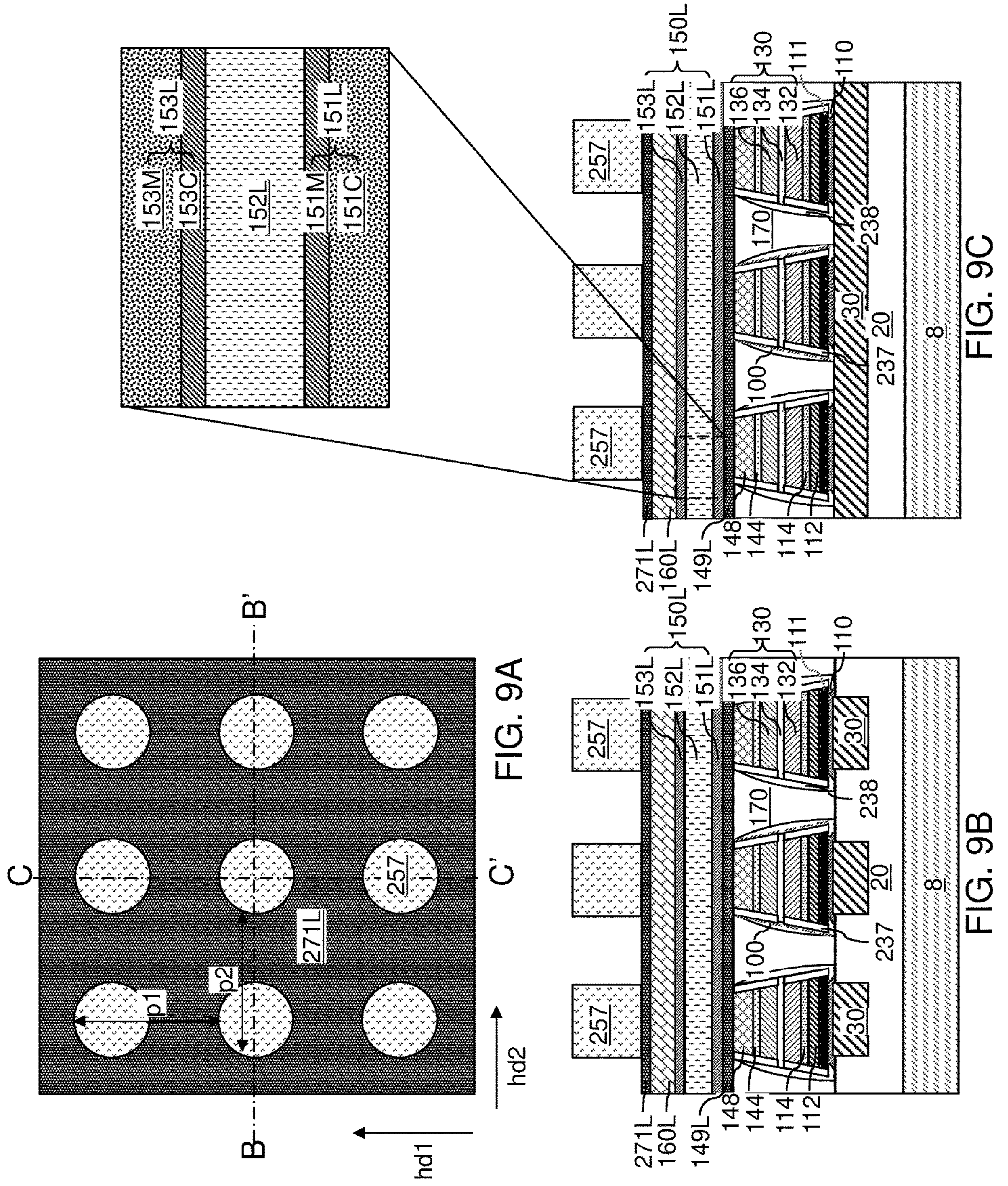
FIGS. 9A-9C are various views of the exemplary structure after formation of selector-level material layers and second etch mask material layers according to an embodiment of the present disclosure.

Referring to FIGS. 9A-9C, an optional metallic adhesion layer 149L, selector-level material layers (150L, 160L), and an optional image transfer assist layer 271L can be formed over the junction-level dielectric material layer 170. The optional metallic adhesion layer 149L comprises a metallic material that promotes adhesion of the selector-level material layers (150L, 160L). For example, the optional metallic adhesion material layer 149L may comprise a metallic material such as Ta, Ti, TaN, TiN, or WN. The thickness of the metallic adhesion material layer 149L may be in a range from 1 nm to 30 nm, although lesser and greater thicknesses may also be employed.

The selector-level material layers (150L, 160L) can include, from bottom to top, selector material layers 150L and an optional conductive material layer 160L (e.g., seed layer). The selector material layers 150L can comprise, from bottom to top, a lower selector electrode material layer 151L, a non-Ohmic selector material layer 152L, and an upper selector electrode material layer 153L. The lower selector electrode material layer 151L includes at least one material that may be employed for lower selector electrodes to be subsequently formed. The non-Ohmic selector material layer 152L includes a selector material that exhibits a non-Ohmic switching behavior. The upper selector electrode material layer 153L includes at least one material that may be employed upper selector electrodes to be subsequently formed.

In one embodiment, the lower selector electrode material layer 151L may comprise a layer stack including a lower carbon-based electrode material layer 151C and a lower metallic material layer 151M formed on the lower carbon-based electrode material layer 151C. In one embodiment, the upper selector electrode material layer 153L may comprise a layer stack including an upper metallic material layer 153M and an upper carbon-based electrode material layer 153C formed on the upper metallic material layer 153M.

The lower carbon-based electrode material layer 151C and the upper carbon-based electrode material layer 153C within the selector-level material layers can include a respective carbon-based conductive material including carbon atoms at an atomic concentration greater than 50%. In one embodiment, the lower carbon-based electrode material layer 151C and the upper carbon-based electrode material layer 153C may include carbon atoms at an atomic concentration in a range from 50% to 100%, such as from 70% to 100% and/or from 80% to 100%. In one embodiment, each of lower carbon-based electrode material layer 151C and the upper carbon-based electrode material layer 153C comprises a respective material selected from diamond-like carbon (DLC), a carbon nitride material, and a carbon-rich conductive compound of carbon atoms and non-carbon atoms. Each of the lower carbon-based electrode material layer 151C and the upper carbon-based electrode material layer 153C may have a respective thickness in a range from 3 nm to 300 nm, although lesser and greater thicknesses may also be employed.

The lower metallic material layer 151M and the upper metallic material layer 153M within the selector material layers 150L can include a respective metallic material having electrical conductivity that is greater than the electrical conductivity of the carbon-based conductive materials of the lower carbon-based electrode material layer 151C and the upper carbon-based electrode material layer 153C. In one embodiment, the lower metallic material layer 151M comprises a metallic material having electrical conductivity that is at least 10 times (which may be at least 30 times and/or at least 100 times and/or at least 1,000 times) the electrical conductivity of the carbon-based conductive material of lower carbon-based electrode material layer 151C, and the upper metallic material layer 153M comprises a second metallic material having electrical conductivity that is at least 10 times (which may be at least 30 times and/or at least 100 times and/or at least 1,000 times) the electrical conductivity of the carbon-based conductive material of the upper carbon-based electrode material layer 153C.

Generally, each of the lower metallic material layer 151M and the upper metallic material layer 153M may comprise, and/or may consist essentially of, a high-conductivity metallic material that has a high electrical conductivity, and thus, is capable of functioning as a current-spreading material that prevents concentration of electrical current in the non-Ohmic material of the non-Ohmic selector material layer 152L. In one embodiment, the lower metallic material layer 151M and/or the upper metallic material layer 153M may comprise, and/or may consist essentially of, an elemental metal, a conductive metallic carbide, or a conductive metallic nitride. In one embodiment, the lower metallic material layer 151M and/or the upper metallic material layer 153M may comprise, and/or may consist essentially of, a respective elemental metal having a melting point higher than 2,000 degrees Celsius (such as refractory metals). In one embodiment, the lower metallic material layer 151M and/or the upper metallic material layer 153M may comprise, and/or may consist essentially of, a respective elemental metal selected from ruthenium, niobium, molybdenum, tantalum, tungsten, or rhenium. In one embodiment, the lower metallic material layer 151M and/or the upper metallic material layer 153M may comprise, and/or may consist essentially of, a conductive metallic carbide such as tungsten carbide. In one embodiment, the lower metallic material layer 151M and/or the upper metallic material layer 153M may comprise, and/or may consist essentially of, a conductive metallic nitride such as tungsten nitride, titanium nitride, or tantalum nitride.

Generally, the lower metallic material layer 151M and the upper metallic material layer 153M may have a lower thickness than the lower carbon-based electrode material layer 151C and the upper carbon-based electrode material layer 153C. Each of the lower metallic material layer 151M and the upper metallic material layer 153M may have a respective thickness in a range from 0.2 nm to 10 nm, such as from 1 nm to 5 nm, although lesser and greater thicknesses may also be employed. In one embodiment, the ratio of the thickness of the lower carbon-based electrode material layer 151C to the thickness of the lower metallic material layer 151M may be in a range from 3.0 to 500, such as from 10 to 100, although lesser and greater ratios may also be employed. In one embodiment, the ratio of the thickness of the upper carbon-based electrode material layer 153C to the thickness of the upper metallic material layer 153M may be in a range from 3.0 to 500, such as from 10 to 100, although lesser and greater ratios may also be employed.

In one embodiment, the non-Ohmic selector material layer 152L within the selector material layers 150L can include any suitable non-Ohmic selector material which exhibits non-linear electrical behavior. For example, the non-Ohmic selector material may comprise an ovonic threshold switch (OTS) material. As used herein, an ovonic threshold switch material refers to a material that displays a non-linear resistivity curve under an applied external bias voltage such that the resistivity of the material decreases with the magnitude of the applied external bias voltage. In other words, the ovonic threshold switch material is non-Ohmic, and becomes more conductive under a higher external bias voltage than under a lower external bias voltage. As used herein, an ovonic threshold switch is a device that includes a chalcogen-containing ovonic threshold switch material layer which does not crystallize in a low resistivity state under a voltage above the threshold voltage, and reverts back to a high resistivity state when not subjected to a voltage above a critical holding voltage across the ovonic threshold switch material layer.

In another embodiment, the non-Ohmic selector material may comprise a volatile conductive bridge material or at least one non-threshold switch material, such as a tunneling selector material or diode materials (e.g., materials for p-n semiconductor diode, p-i-n semiconductor diode, Schottky diode or metal-insulator-metal diode). Thus, the material layer 152L may comprise a diode layer stack, such as a layer stack of p-doped semiconductor material layer and an n-doped semiconductor material layer, or a layer stack of a p-doped semiconductor material layer, an intrinsic semiconductor material layer, and an n-doped semiconductor material layer.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The ovonic threshold switch material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise an amorphous chalcogenide material, such as a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si. The thickness of the non-Ohmic material layer 152L can be, for example, in a range from 1 nm to 50 nm, such as from 5 nm to 25 nm, although lesser and greater thicknesses can also be employed.

The optional conductive material layer 160L includes a nonmagnetic conductive material such as Ta and/or Pt, which can function as a seed layer for the magnetic-tunnel-junction-level (MTJ-level) material layers to be formed thereon The thickness of the conductive material layer 160L can be in a range from 1 nm to 10 nm, although lesser and greater thicknesses can also be employed.

The optional image transfer assist layer 271L includes a hard mask material that can provide a high etch resistance for an anisotropic etch process to be subsequently employed with respect to the material of the underlying layers. For example, the optional image transfer assist layer 271L may comprise a metal such as TiN, TaN, WN, Ti, W, Cr, or Ru. The thickness of the image transfer assist layer 271L may be in a range from 1 nm to 30 nm, such as from 2 nm to 10 nm, although lesser and greater thicknesses may also be employed.

A photoresist layer can be applied over the selector-level material layers (150L, 160L) and the optional image transfer assist layer 271L, and can be lithographically patterned to form a second patterned photoresist layer 257. The second patterned photoresist layer 257 can be patterned with a same pattern as the two-dimensional array of magnetic tunnel junctions 130. The second patterned photoresist layer 257 may comprise a two-dimensional periodic array of patterned photoresist material portions having the first pitch p1 along the first horizontal direction hd1, and having the second pitch p2 along the second horizontal direction hd2.

Figures 10A, 10B, 10C:
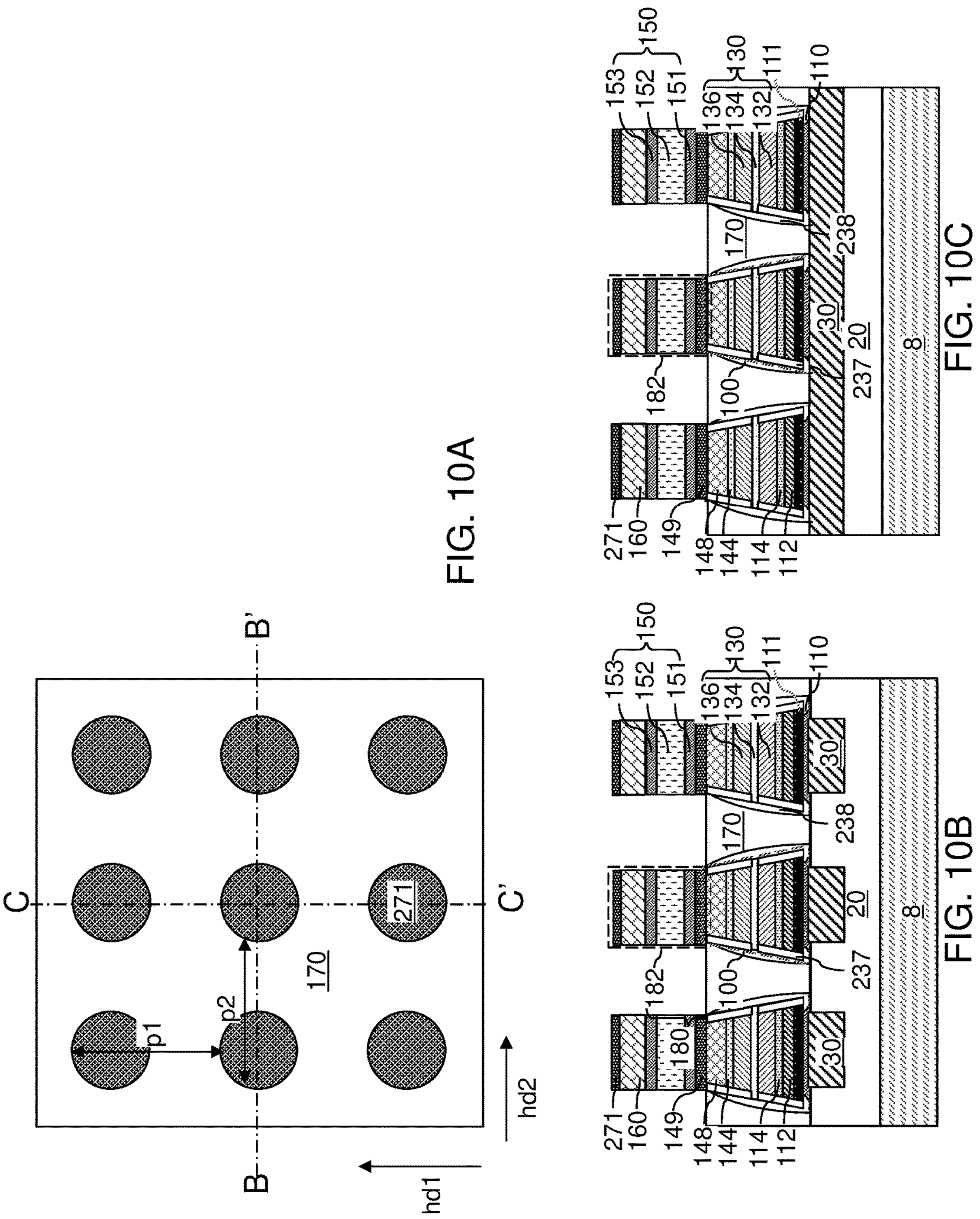
FIGS. 10A-10C are various views of the exemplary structure after formation of a two-dimensional array of selector elements according to an embodiment of the present disclosure.

Referring to FIGS. 10A-10C, a first anisotropic etch process can be performed to transfer the pattern in the second patterned photoresist layer 257 through the image transfer assist layer 271L. The image transfer assist layer 271L can be patterned into etch mask portions 271. Each etch mask portion 271 is a patterned portion of the image transfer assist layer 271L, and may laterally extend along the first horizontal direction hd1 with a uniform width along the second horizontal direction hd2. A two-dimensional periodic array of etch mask portions 271 can be formed, which can have a periodicity of the second pitch p2 along the second horizontal direction hd2.

A second anisotropic etch process can be performed to transfer the pattern in the second patterned photoresist layer 257 and/or in the etch mask portions 271 through the selector-level material layers (150L, 160L) and the metallic adhesion layer 149L. The second patterned photoresist layer 257 and/or in the etch mask portions 271 can be employed as an etch mask for the second anisotropic etch process. The second patterned photoresist layer 257 may be removed prior to the second anisotropic etch process, may be consumed during the second anisotropic etch process, or may be removed after the second anisotropic etch process. The etch mask portions 271 (which are patterned portions of the image transfer assist layer 271L) may be consumed during the second anisotropic etch process or after the second anisotropic etch process.

A two-dimensional array of pillars 182 can be formed over the two-dimensional array of magnetic tunnel junctions 130. Each pillar 182 comprises, from bottom to top, a metallic adhesion material portion 149, a selector element 150, and a conductive material plate 160. Each pillar 182 can be a discrete patterned portion of the layer stack including the optional metallic adhesion layer 149L, the selector-level material layers (150L, 160L), and the optional image transfer assist layer 271L. Specifically, each pillar 182 may include, from bottom to top, a metallic adhesion material portion 149, a selector element 150, a conductive material plate 160, and an image transfer assist material plate 271. Each metallic adhesion material portion can be a patterned portion of the metallic adhesion layer 149L. Each selector element 150 comprises a vertical stack of a lower selector electrode 151, a non-Ohmic selector material portion 152, and an upper selector electrode 153. Each image transfer assist material plate 271 can be a patterned portion of the image transfer assist layer 271L. Generally, a two-dimensional array of selector elements 150 can be formed above the two-dimensional array of the MRAM pillars 100 such that each selector element 150 is in a series connection with a respective one of the MRAM pillars 100.

Figure 11A:
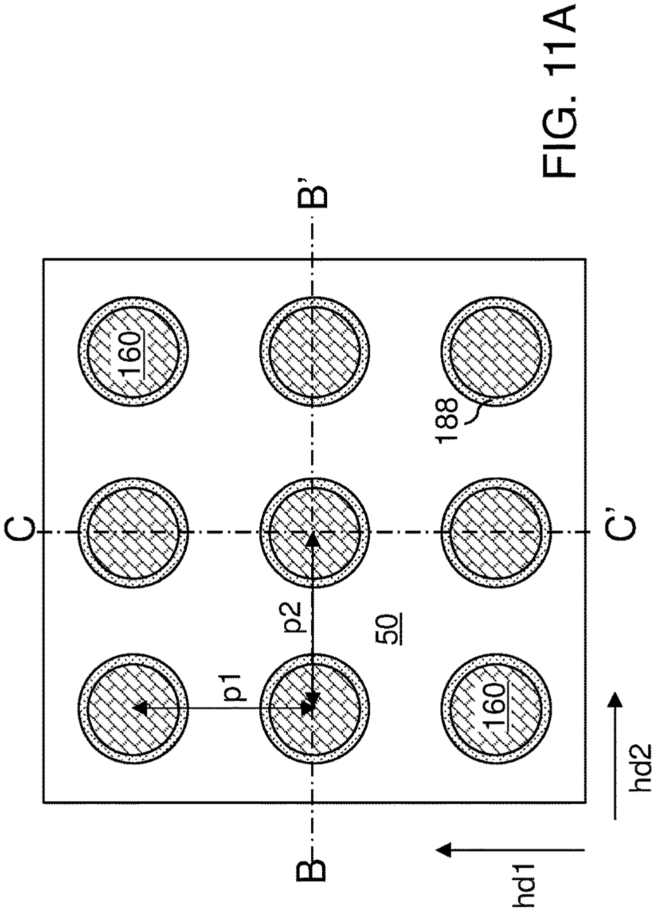
FIGS. 11A-11C are various views of the exemplary structure after formation of a selector-level dielectric material layer according to an embodiment of the present disclosure.
Figure 11B:
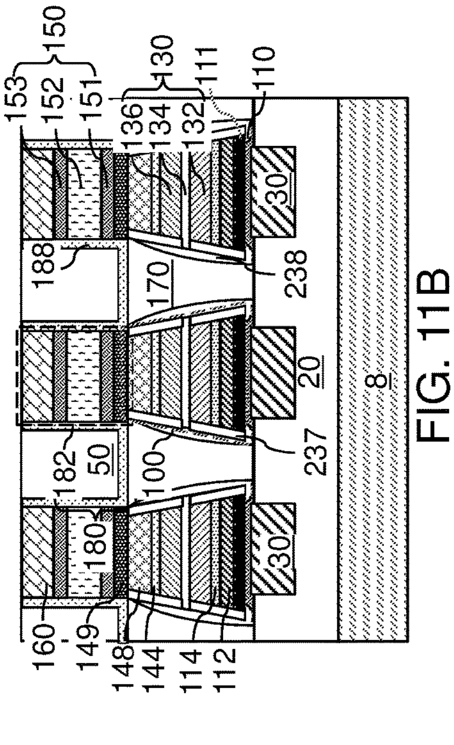
Figure 11C:
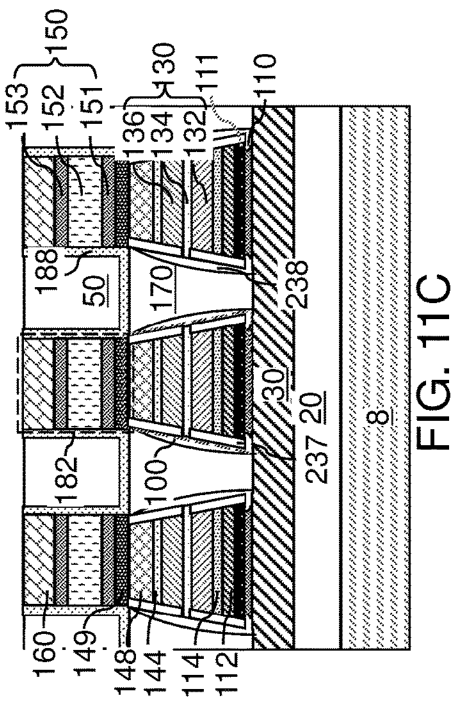

Referring to FIGS. 11A-11C, an optional dielectric passivation layer 188 can be conformally deposited over the two-dimensional array of pillars 182 and over the junction-level dielectric material layer 170. The dielectric passivation layer 188 may comprise silicon nitride or silicon carbide nitride. The thickness of the dielectric passivation layer 188 may be in a range from 4 nm to 20 nm, although lesser and greater thicknesses may also be employed.

Subsequently, a dielectric fill material can be deposited in the gaps between neighboring pairs of the pillars 182 to fill the volumes of the gaps. The dielectric fill material may comprise silicon oxide, organosilicate glass, silicon nitride, or a dielectric metal oxide. For example, the dielectric fill material may comprise undoped silicate glass (i.e., silicon oxide) or a doped silicate glass. A planarization process, such as a chemical mechanical polishing process can be performed to remove portions of the dielectric fill material that are deposited above the horizontal plane including the top surfaces of the conductive material plates 160. Top portions of the dielectric passivation layer 188 and the image transfer assist material plates 271 can be collaterally removed by the planarization process.

Remaining portions of the dielectric fill material that fills the gaps between neighboring pairs of the pillars 182 is herein referred to as a selector-level dielectric material layer 50. The selector-level dielectric material layer 50 is a unitary structure, i.e., a single continuous structure of which all portions are interconnected among one another without any interface thereamongst. The dielectric passivation layer 188 laterally surrounds and contacts each selector element 150 within the two-dimensional array of selector elements 150. The selector-level dielectric material layer 50 overlies a horizontally-extending portion of the dielectric passivation layer 188. In one embodiment, the top surfaces of the dielectric passivation layer 188 and the top surface of the elector-level dielectric material layer 50 are located within a same horizontal plane, which may be the horizontal plane including the top surfaces of the conductive material plates 160.

Figure 12A:
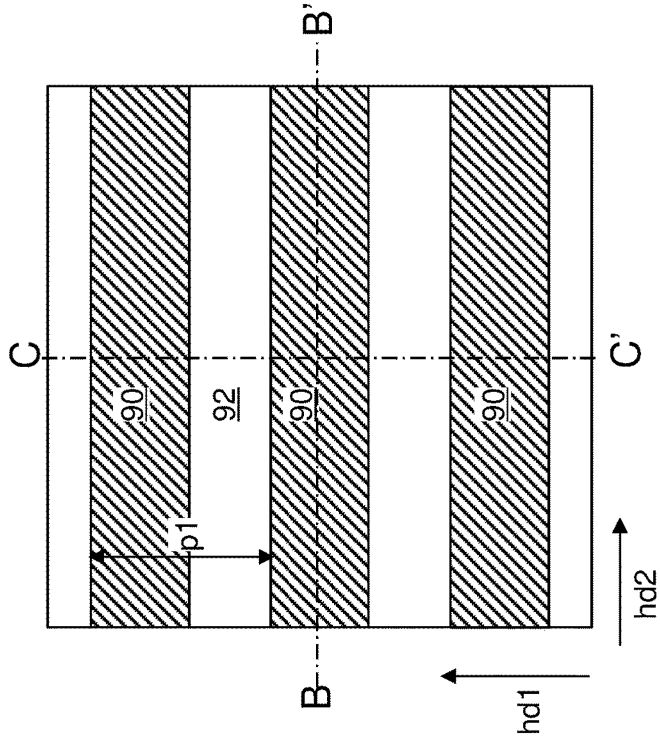
FIGS. 12A-12C are various views of the exemplary structure after formation of second electrically conductive lines according to an embodiment of the present disclosure.
Figure 12B:
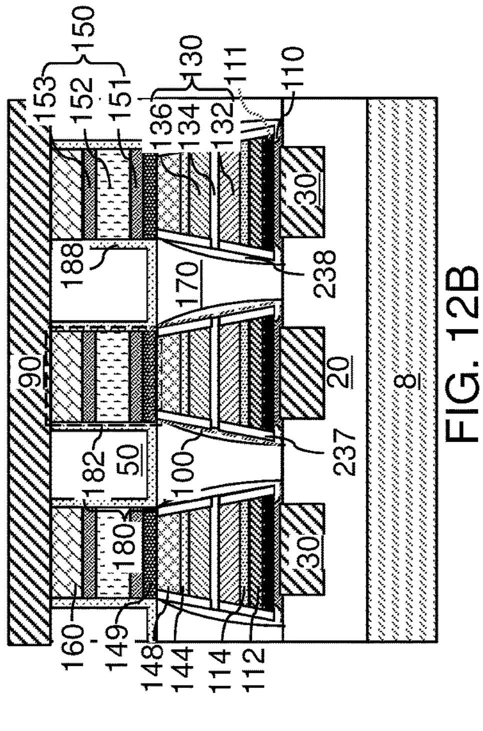
Figure 12C:
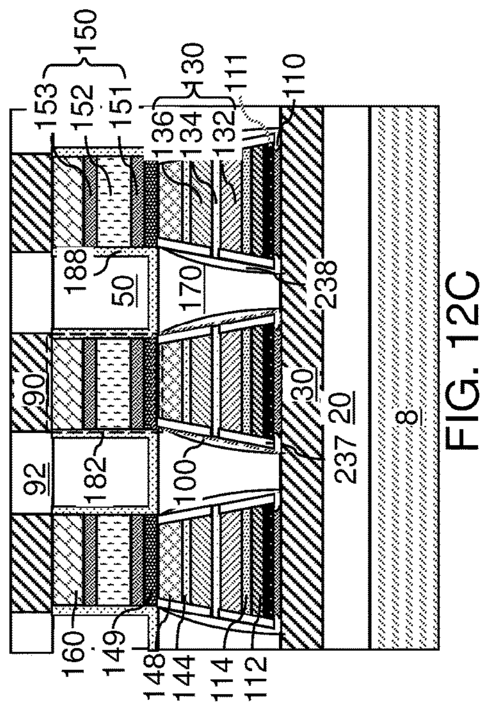

Referring to FIGS. 12A-12C, a dielectric material can be deposited over the selector-level dielectric material layer 50 to form a second line-level dielectric layer 92. Line trenches laterally extending along the second horizontal direction hd2 can be formed through the second line-level dielectric layer 92 above each column of pillars 182 arranged along the second horizontal direction hd2. A conductive material can be deposited in the line trenches, and excess portions of the conductive material can be removed from above the horizontal plane including the top surface of the second line-level dielectric layer 92. Remaining portions of the conductive material filling the line trenches constitute second electrically conductive lines (e.g., bit lines) 90. The second electrically conductive lines 90 comprise, and/or consist essentially of, a nonmagnetic electrically conductive material such as Al, Cu, W, Ru, Mo, Nb, Ti, Ta, TiN, TaN, WN, MON, or combinations thereof. The thickness of the second electrically conductive lines 90 can be in a range from 30 nm to 200 nm, although lesser and greater thicknesses can also be employed. Alternatively, instead of using the above-described damascene process to form the second electrically conductive lines 90, these lines may be formed by a pattern and etch process. In the pattern and etch process, a continuous electrically conductive layer is patterned into the second electrically conductive lines 90 by photolithography and etching. The second line-level dielectric layer 92 is then deposited between the second electrically conductive lines 90 and optionally planarized with the top surfaces of the second electrically conductive lines 90.

Referring to all drawings and according to various embodiments of the present disclosure, a device structure (e.g., an MRAM cell 180) comprises first electrically conductive lines 30 that are laterally spaced apart from each other; second electrically conductive lines 90 that are vertically spaced apart from the first electrically conductive lines 30 and are laterally spaced apart from each other; a two-dimensional array of magnetoresistive random access memory (MRAM) pillars 100 located between the first electrically conductive lines 30 and the second electrically conductive lines 90, wherein each of the MRAM pillars 100 comprises a respective reference layer 132, a respective nonmagnetic tunnel barrier layer 134, and a respective free layer 136; and a two-dimensional array of carbon-based layers 110 contacting surfaces of the first electrically conductive lines 30 and surfaces of the two-dimensional array of MRAM pillars 100.

In one embodiment, the two-dimensional array of carbon-based layers 110 underlies the two-dimensional array of MRAM pillars 100 and contacts bottom surfaces of the two-dimensional array of MRAM pillars 100 and contacts top surfaces of the first electrically conductive lines 30.

In one embodiment, a first line-level dielectric layer 20 embeds the first electrically conductive lines 30. The two-dimensional array of carbon-based layers 110 comprise bottom surface segments that contact top surface segments of the first line-level dielectric layer 20.

In one embodiment, at least one carbon-based layer 110 within the two-dimensional array of carbon-based layers 110 comprises: a central portion in contact with the top surface of a respective underlying one of the first electrically conductive lines 30 and having a first thickness t1; and a peripheral portion in contact with a respective one of the top surface segments of the first line-level dielectric layer 20 and having a second thickness t2 that is different from the first thickness.

In one embodiment, a two-dimensional array of metal oxide spacers 237 laterally surround the two-dimensional array of MRAM pillars 100.

In one embodiment, at least one carbon-based layer 110 within the two-dimensional array of carbon-based layers 110 has a respective sidewall that is laterally recessed inward from a bottom periphery of an outer sidewall of a respective overlying metal oxide spacer 237 within the two-dimensional array of metal oxide spacers 237.

In one embodiment, the two-dimensional array of metal oxide spacers 237 is vertically spaced from and does not contact the first electrically conductive lines 30.

In one embodiment, the two-dimensional array of metal oxide spacers 237 comprises oxide of metallic elements within metallic materials of the two-dimensional array of MRAM pillars 100, and has an inhomogeneous compositional profile along a vertical direction.

In some embodiments shown in FIGS. 7F and 7G, the two-dimensional array of metal oxide spacers 237 does not contact the two-dimensional array of carbon-based layers 110. In other embodiments shown in FIGS. 7D and 7E, two-dimensional array of metal oxide spacers 237 contacts a respective carbon-based layer 110 of the two-dimensional array of carbon-based layers 110.

In one embodiment, the two-dimensional array of carbon-based layers 110 include carbon at an atomic percentage greater than 50% and a resistivity of less than 10 milliOhm-cm (i.e., the carbon-based layers are electrically conductive). The two-dimensional array of carbon-based layers 110 may comprise amorphous carbon, diamond-like carbon, a carbon-semiconductor alloy, a carbon-nitrogen alloy, a carbon-boron alloy, or a carbon-boron-nitrogen alloy.

In one embodiment, at least one carbon-based layer 110 within the two-dimensional array of carbon-based layers 110 comprises a respective tapered concave sidewall.

In one embodiment, a two-dimensional array of selector pillars 150 is interposed between the two-dimensional array of MRAM pillars 100 and the second electrically conductive lines 90.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A device structure, comprising:

first electrically conductive lines that are laterally spaced apart from each other;

second electrically conductive lines that are vertically spaced apart from the first electrically conductive lines and are laterally spaced apart from each other;

a two-dimensional array of magnetoresistive random access memory (MRAM) pillars located between the first electrically conductive lines and the second electrically conductive lines, wherein each of the MRAM pillars comprises a respective reference layer, a respective nonmagnetic tunnel barrier layer, and a respective free layer;

a two-dimensional array of carbon-based layers contacting surfaces of the first electrically conductive lines and surfaces of the two-dimensional array of MRAM pillars, wherein the two-dimensional array of carbon-based layers underlies the two-dimensional array of MRAM pillars and contacts bottom surfaces of the two-dimensional array of MRAM pillars and contacts top surfaces of the first electrically conductive lines; and a first line-level dielectric layer embedding the first electrically conductive lines, wherein the two-dimensional array of carbon-based layers comprise bottom surface segments that contact top surface segments of the first line-level dielectric layer.

2. The device structure of claim 1, wherein at least one carbon-based layer within the two-dimensional array of carbon-based layers comprises:

a central portion in contact with the top surface of a respective underlying one of the first electrically conductive lines and having a first thickness; and a peripheral portion in contact with a respective one of the top surface segments of the first line-level dielectric layer and having a second thickness that is different from the first thickness.

3. The device structure of claim 1, further comprising a two-dimensional array of metal oxide spacers laterally surrounding the two-dimensional array of MRAM pillars.

4. The device structure of claim 3, wherein at least one carbon-based layer within the two-dimensional array of carbon-based layers has a respective sidewall that is laterally recessed inward from a bottom periphery of an outer sidewall of a respective overlying metal oxide spacer within the two-dimensional array of metal oxide spacers.

5. The device structure of claim 3, wherein the two-dimensional array of metal oxide spacers is vertically spaced from and does not contact the first electrically conductive lines.

6. The device structure of claim 3, wherein the two-dimensional array of metal oxide spacers comprises oxide of metallic elements within metallic materials of the two-dimensional array of MRAM pillars, and has an inhomogeneous compositional profile along a vertical direction.

7. The device structure of claim 3, wherein the two-dimensional array of metal oxide spacers does not contact the two-dimensional array of carbon-based layers.

8. The device structure of claim 3, wherein the two-dimensional array of metal oxide spacers contacts a respective carbon-based layer of the two-dimensional array of carbon-based layers.

9. The device structure of claim 1, wherein:

the two-dimensional array of carbon-based layers include carbon at an atomic percentage greater than 50% and a resistivity of less than 10 milliOhm-cm; and the two-dimensional array of carbon-based layers comprise, amorphous carbon, diamond-like carbon, a carbon-semiconductor alloy, a carbon-nitrogen alloy, a carbon-boron alloy, or a carbon-boron-nitrogen alloy.

10. The device structure of claim 1, wherein at least one carbon-based layer within the two-dimensional array of carbon-based layers comprises a respective tapered concave sidewall.

11. The device structure of claim 1, further comprising a two-dimensional array of selector pillars interposed between the two-dimensional array of MRAM pillars and the second electrically conductive lines.

12. A computer system comprising a computer memory containing the device structure of claim 1.

13. A device structure, comprising:

first electrically conductive lines that are laterally spaced apart from each other;

second electrically conductive lines that are vertically spaced apart from the first electrically conductive lines and are laterally spaced apart from each other;

a two-dimensional array of magnetoresistive random access memory (MRAM) pillars located between the first electrically conductive lines and the second electrically conductive lines, wherein each of the MRAM pillars comprises a respective reference layer, a respective nonmagnetic tunnel barrier layer, and a respective free layer;

a two-dimensional array of carbon-based layers contacting surfaces of the first electrically conductive lines and surfaces of the two-dimensional array of MRAM pillars; and a two-dimensional array of metal oxide spacers laterally surrounding the two-dimensional array of MRAM pillars, wherein at least one carbon-based layer within the two-dimensional array of carbon-based layers has a respective sidewall that is laterally recessed inward from a bottom periphery of an outer sidewall of a respective overlying metal oxide spacer within the two-dimensional array of metal oxide spacers.

14. A device structure, comprising:

first electrically conductive lines that are laterally spaced apart from each other;

second electrically conductive lines that are vertically spaced apart from the first electrically conductive lines and are laterally spaced apart from each other;

a two-dimensional array of magnetoresistive random access memory (MRAM) pillars located between the first electrically conductive lines and the second electrically conductive lines, wherein each of the MRAM pillars comprises a respective reference layer, a respective nonmagnetic tunnel barrier layer, and a respective free layer;

a two-dimensional array of carbon-based layers contacting surfaces of the first electrically conductive lines and surfaces of the two-dimensional array of MRAM pillars; and a two-dimensional array of metal oxide spacers laterally surrounding the two-dimensional array of MRAM pillars, wherein the two-dimensional array of metal oxide spacers comprises oxide of metallic elements within metallic materials of the two-dimensional array of MRAM pillars, and has an inhomogeneous compositional profile along a vertical direction.

15. A device structure, comprising:

first electrically conductive lines that are laterally spaced apart from each other;

second electrically conductive lines that are vertically spaced apart from the first electrically conductive lines and are laterally spaced apart from each other;

a two-dimensional array of magnetoresistive random access memory (MRAM) pillars located between the first electrically conductive lines and the second electrically conductive lines, wherein each of the MRAM pillars comprises a respective reference layer, a respective nonmagnetic tunnel barrier layer, and a respective free layer;

a two-dimensional array of carbon-based layers contacting surfaces of the first electrically conductive lines and surfaces of the two-dimensional array of MRAM pillars; and a two-dimensional array of metal oxide spacers laterally surrounding the two-dimensional array of MRAM pillars, wherein the two-dimensional array of metal oxide spacers does not contact the two-dimensional array of carbon-based layers.

* * * * *